(12) United States Patent
Kim et al.

(10) Patent No.: US 11,844,248 B2
(45) Date of Patent: Dec. 12, 2023

(54) DISPLAY PANEL AND DISPLAY APPARATUS INCLUDING THE SAME

(71) Applicant: Samsung Display Co., Ltd., Yongin-si (KR)

(72) Inventors: Sunghwan Kim, Yongin-si (KR); Wonkyu Kwak, Yongin-si (KR); Junghoon Shim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 185 days.

(21) Appl. No.: 17/135,704

(22) Filed: Dec. 28, 2020

(65) Prior Publication Data

US 2021/0313410 A1 Oct. 7, 2021

(30) Foreign Application Priority Data

Apr. 6, 2020 (KR) ................. 10-2020-0041613

(51) Int. Cl.
*G09G 3/32* (2016.01)
*H10K 59/131* (2023.01)
*H10K 59/35* (2023.01)

(52) U.S. Cl.
CPC ......... *H10K 59/131* (2023.02); *H10K 59/353* (2023.02)

(58) Field of Classification Search
CPC ...... G06V 20/56; G06V 20/50; G05D 1/0088; G05D 1/0251; G05D 2201/0213; G06K 9/6218; G06T 3/40; G06T 7/11; G06T 2207/20081; G06T 2207/30252; H10K 59/121; H10K 59/353; H10K 59/131; G09G 3/32
See application file for complete search history.

(56) References Cited

U.S. PATENT DOCUMENTS

| | | | |
|---|---|---|---|
| 10,134,829 B2 | 11/2018 | Shin et al. | |
| 10,367,046 B2 | 7/2019 | Lee et al. | |
| 10,573,243 B2 | 2/2020 | Choi et al. | |
| 2011/0284749 A1* | 11/2011 | Okada | G01T 1/2018 250/361 R |

(Continued)

FOREIGN PATENT DOCUMENTS

| | | |
|---|---|---|
| CN | 208507679 U | 2/2019 |
| CN | 110070801 A | 7/2019 |

(Continued)

*Primary Examiner* — Pegeman Karimi

(74) *Attorney, Agent, or Firm* — Lewis Roca Rothgerber Christie LLP

(57) ABSTRACT

A display panel includes: a main display area; a component area including a transmission area; a peripheral area outside the main display area; a substrate; main display elements on the substrate to correspond to the main display area; main pixel circuits respectively connected to the main display elements; auxiliary display elements on the substrate to correspond to the component area; auxiliary pixel circuits respectively connected to the auxiliary display elements; a driving voltage line to apply a driving voltage to the main pixel circuits; a data line to apply a data signal to the main pixel circuits; a bottom metal layer between the substrate and the auxiliary pixel circuits at the component area; and a bias wire connected to the bottom metal layer, and located at the main display area.

21 Claims, 18 Drawing Sheets

(56) References Cited

U.S. PATENT DOCUMENTS

| | | | | |
|---|---|---|---|---|
| 2019/0095046 A1* | 3/2019 | Guo | ......................... | G06F 3/043 |
| 2020/0105204 A1* | 4/2020 | Choe | ..................... | G09G 3/3258 |
| 2020/0302853 A1* | 9/2020 | Ono | ..................... | G09G 3/2074 |
| 2022/0310574 A1* | 9/2022 | Kim | ...................... | H01L 25/167 |

FOREIGN PATENT DOCUMENTS

| | | | |
|---|---|---|---|
| KR | 10-2018-0058265 | A | 6/2018 |
| KR | 10-2018-0072440 | A | 6/2018 |
| KR | 10-2018-0089928 | A | 8/2018 |
| KR | 10-1980781 | B1 | 5/2019 |

* cited by examiner

DISPLAY PANEL AND DISPLAY APPARATUS INCLUDING THE SAME

CROSS-REFERENCE TO RELATED APPLICATION

This application claims priority to and the benefit of Korean Patent Application No. 10-2020-0041613, filed on Apr. 6, 2020, in the Korean Intellectual Property Office, the disclosure of which is incorporated by reference herein in its entirety.

BACKGROUND

1. Field

Aspects of one or more embodiments relate to a display panel and a display apparatus including the same, and more particularly, to a display panel including a display area extended to display an image even in an area where a component, for example, such as an electronic element, is arranged, and a display apparatus including the display panel.

2. Description of Related Art

Recently, display apparatuses have been used for various purposes. Also, thin and light-weight display apparatuses have been manufactured, and thus, the usage range of the display apparatuses has increased.

As the display apparatuses are used in various ways, there may be various methods for designing various different forms of the display apparatuses, and the number of functions that may be added to or associated with the display apparatuses has increased.

The above information disclosed in this Background section is for enhancement of understanding of the background of the present disclosure, and therefore, it may contain information that does not constitute prior art.

SUMMARY

One or more example embodiments of the present disclosure are directed to a display panel including a display area extended to display an image even at (e.g., in or on) an area where a component, for example, such as an electronic element, is arranged, and a display apparatus including the display panel.

However, the present disclosure is not limited thereto, and additional aspects and features will be set forth in part in the description which follows and, in part, will be apparent from the description, or may be learned by practice of one or more example embodiments of the present disclosure.

According to one or more example embodiments of the present disclosure, a display panel includes: a main display area; a component area including a transmission area; a peripheral area outside the main display area; a substrate; main display elements on the substrate to correspond to the main display area; main pixel circuits respectively connected to the main display elements; auxiliary display elements on the substrate to correspond to the component area; auxiliary pixel circuits respectively connected to the auxiliary display elements; a driving voltage line configured to apply a driving voltage to the main pixel circuits; a data line configured to apply a data signal to the main pixel circuits; a bottom metal layer between the substrate and the auxiliary pixel circuits at the component area; and a bias wire connected to the bottom metal layer, and located at the main display area.

In an example embodiment, the display panel may further include: a bias voltage supply line at the peripheral area, and the bias wire may be connected to the bias voltage supply line.

In an example embodiment, the bias wire may be at a different layer from that of the driving voltage line, and may at least partially overlap with the driving voltage line.

In an example embodiment, a width of the bias wire may be less than that of the driving voltage line.

In an example embodiment, the bias wire may be located over the driving voltage line, and may be connected to the bottom metal layer through a contact hole.

In an example embodiment, the main display elements of the main display area may implement main sub-pixels including red, green, and blue pixels, and the bias wire may include a first bias wire overlapping with the red pixel, and a second bias wire overlapping with the blue pixel.

In an example embodiment, the main sub-pixels may be arranged in a PenTile structure.

In an example embodiment, the main display elements of the main display area may implement main sub-pixels including red, green, and blue pixels, and the bias wire may overlap with the green pixel.

In an example embodiment, the bias wire may be integrally formed with the bottom metal layer, and may overlap with the data line.

In an example embodiment, the main display elements of the main display area may implement main sub-pixels including red, green, and blue pixels, and the bias wire may include a first bias wire overlapping with a pixel circuit from among the main pixel circuits configured to drive the red pixel, and a second bias wire overlapping with a pixel circuit from among the main pixel circuits configured to drive the blue pixel.

In an example embodiment, the bottom metal layer may include a lower hole corresponding to the transmission area.

In an example embodiment, at least some wires that pass through the component area may be bent to bypass the transmission area.

In an example embodiment, the component area may include a plurality of pixel groups, each including a plurality of the auxiliary display elements; the transmission area may include a plurality of transmission areas corresponding to the component area; and the plurality of pixel groups and the plurality of transmission areas may be alternately arranged at the component area.

According to one or more example embodiments of the present disclosure, a display apparatus includes: a display panel including: a main display area including main sub-pixels; and a component area including auxiliary sub-pixels and a transmission area; and a component located below the display panel, and corresponding to the component area. The display panel further includes: a substrate; a driving voltage line over the substrate at the main display area; a bottom metal layer at the component area, and located between the substrate and auxiliary pixel circuits configured to drive the auxiliary sub-pixels; and a bias wire connected to the bottom metal layer, and located at a different layer from that of the driving voltage line.

In an example embodiment, the bias wire may at least partially overlap with the driving voltage line.

In an example embodiment, a width of the bias wire may be less than that of the driving voltage line.

In an example embodiment, the main sub-pixels may include red, green, and blue pixels, and the bias wire may overlap with at least one of the red, green, or blue pixels.

In an example embodiment, the bias wire may include a plurality of bias wires, and may be integrally formed with the bottom metal layer.

In an example embodiment, the bottom metal layer may include a lower hole corresponding to the transmission area.

In an example embodiment, at least some wires that pass through the component area may be bent to bypass the transmission area.

BRIEF DESCRIPTION OF THE DRAWINGS

The above and other aspects and features of the present disclosure will become more apparent to those skilled in the art from the following detailed description of the example embodiments with reference to the accompanying drawings, in which.

DETAILED DESCRIPTION

Figure 1:
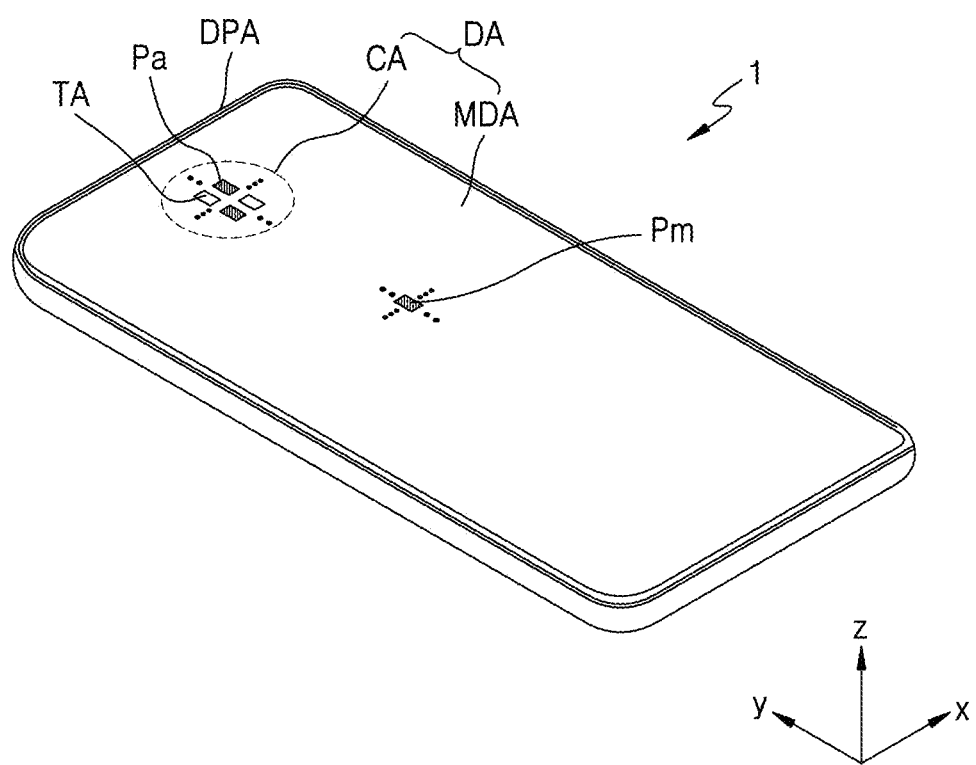
FIG. 1 is a schematic perspective view of a display apparatus according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. For example, the sizes and thicknesses of elements in the drawings may be arbitrarily illustrated for convenience of illustration, but the present disclosure is not limited thereto. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein and as shown in the figures, the x-axis, the y-axis and the z-axis are not limited to three axes of the rectangular coordinate system, and may be interpreted in a broader sense. For example, the x-axis, the y-axis, and the z-axis may be perpendicular to one another or may represent different directions that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. For example, the expression "at least one of a, b or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic perspective view of a display apparatus 1 according to an embodiment.

Referring to FIG. 1, the display apparatus 1 includes a display area DA, and a peripheral area DPA outside the display area DA. The display area DA includes a component area CA, and a main display area MDA at least partially surrounding (e.g., around a periphery of) the component area CA. In other words, the component area CA and the main display area MDA may display images individually or may display images together. The peripheral area DPA may be a non-display area where no display element is arranged. The display area DA may be entirely surrounded (e.g., around a periphery thereof) by the peripheral area DPA.

FIG. 1 shows one component area CA at (e.g., in or on) the main display area MDA. However, the preset disclosure is not limited thereto, and in another embodiment, the display apparatus 1 may have two or more component areas CA, and shapes and sizes of the plurality of component areas CA may be the same or substantially the same as each other, or may be different from each other. When viewed from a direction that is vertical or substantially vertical to an upper surface of the display apparatus 1 (e.g., when viewed from a plan view), the component area CA may have various suitable shapes, for example, such as a quadrilateral shape, a star shape, a diamond shape, or any other suitable polygonal shape, a circular shape, an oval shape, or the like. Although FIG. 1 shows the component area CA arranged at (e.g., in or on) an upper (e.g., in a +y-axis direction) central area of the main display area MDA, which may have a quadrilateral shape or a substantially quadrilateral shape when viewed from a direction substantially vertical to an upper surface of the display apparatus 1 (e.g., when viewed from a plan view), the present disclosure is not limited thereto, and the component area CA may be arranged on one side of the main display area MDA having the quadrilateral shape, for example, such as an upper right side or an upper left side of the main display area MDA.

The display apparatus 1 may provide an image by using a plurality of main sub-pixels Pm arranged at (e.g., in or on) the main display area MDA, and a plurality of auxiliary sub-pixels Pa arranged at (e.g., in or on) the component area CA.

As described in more detail below with reference to FIG. 2, at (e.g., in or on) the component area CA, a component 40, which may be an electronic element, may be arranged below a display panel to correspond to the component area CA. For example, in some embodiments, the component 40 may be a camera using infrared rays or visible light, and may include an imaging device. In some embodiments, the component may be a solar cell, a flash, an illuminance sensor, a proximity sensor, an iris sensor, and/or the like. In some embodiments, the component 40 may have a function of receiving sound, for example, such as a microphone and/or the like.

To reduce a limitation of the function of the component 40, the component area CA may include a transmission area TA capable of transmitting light and/or sound output from the component 40 to the outside or traveling from the outside toward the component 40. In a display panel according to an embodiment and a display apparatus including the same, when light is transmitted through the component area CA, light transmittance may be about 10% or more, and more particularly, may be 25% or more, 40% or more, 50% or more, 85% or more, or 90% or more.

The plurality of auxiliary sub-pixels Pa may be arranged at (e.g., in or on) the component area CA. The plurality of auxiliary sub-pixels Pa may provide a desired image (e.g., a certain image) by emitting light. An image displayed at (e.g., in or on) the component area CA may be referred to as an auxiliary image, and may have a lower resolution than an image displayed at (e.g., in or on) the main display area MDA. In other words, the component area CA includes the transmission area TA capable of transmitting light and/or sound, and when no sub-pixel is arranged at (e.g., in or on) the transmission area TA, the number of auxiliary sub-pixels Pa that may be arranged per unit area at (e.g., in or on) the component area CA may be less than the number of main sub-pixels Pm that are arranged per unit area at (e.g., in or on) the main display area MDA.

Figure 2:
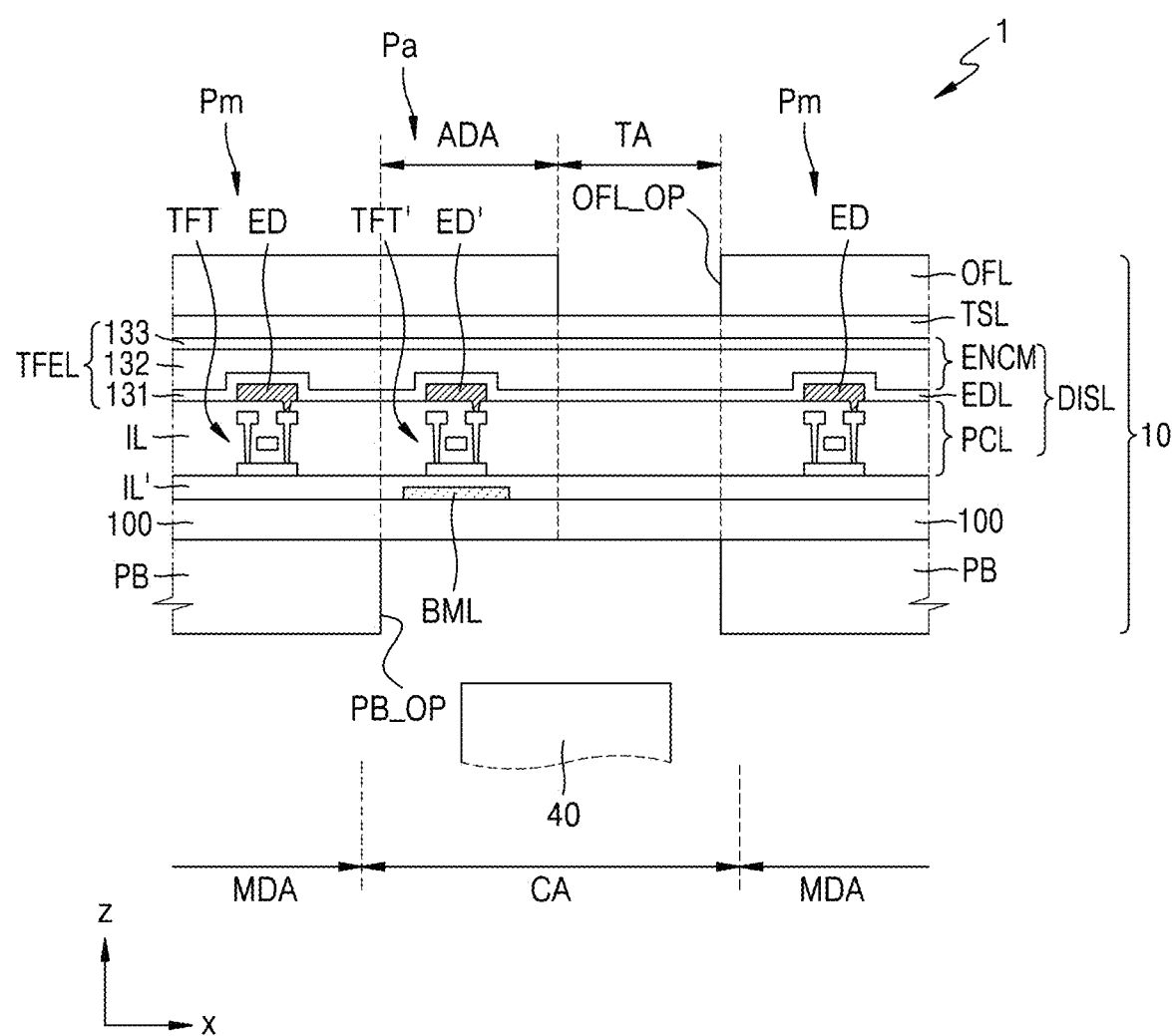
FIG. 2 is a schematic cross-sectional view of a portion of a display apparatus according to an embodiment.

FIG. 2 is a schematic cross-sectional view of a portion of the display apparatus 1 according to an embodiment.

Referring to FIG. 2, the display apparatus 1 may include a display panel 10, and the component 40 overlapping with the display panel 10. In some embodiments, a cover window for protecting the display panel 10 may be further arranged on the display panel 10.

The display panel 10 includes the component area CA, which is an area overlapping with the component 40, and the main display area MDA where a main image is displayed. The display panel 10 may include a substrate 100, a display layer DISL on the substrate 100, a touchscreen layer TSL, an optical function layer OFL, and a panel protection member PB arranged under (e.g., underneath) the substrate 100.

The display layer DISL may include a circuit layer PCL including a plurality of thin film transistors TFT and TFT', a display element layer EDL including a plurality of light-emitting elements ED and ED', which are display elements, and a sealing member ENCM, for example, such as a thin film encapsulation layer TFEL shown in FIG. 2 or a sealing substrate. Insulating layers IL and IL' may be arranged between the substrate 100 and the display layer DISL, and/or in the display layer DISL.

The substrate 100 may include an insulating material, for example, such as glass, quartz, polymer resin, and/or the like. The substrate 100 may be a rigid substrate, or a flexible substrate capable of being bent, folded, rolled, and/or the like.

The main thin film transistor TFT and the main light-emitting element ED connected thereto may be arranged at (e.g., in or on) the main display area MDA of the display panel 10 to implement a main sub-pixel Pm. The auxiliary thin film transistor TFT' and the auxiliary light-emitting element ED' connected thereto may be arranged at (e.g., in or on) the component area CA to implement an auxiliary sub-pixel Pa. An area of the component area CA where the auxiliary sub-pixel Pa is arranged may be referred to as an auxiliary display area ADA.

The transmission area TA where no display element is arranged may be arranged at (e.g., in or on) the component area CA. The transmission area TA may be an area where light and/or a signal emitted from the component 40 corresponding to the component area CA is transmitted, and/or where light and/or a signal incident on the component 40 is transmitted. The auxiliary display area ADA and the transmission area TA may be alternately arranged at (e.g., in or on) the component area CA.

A bottom metal layer BML may be arranged at (e.g., in or on) the component area CA. The bottom metal layer BML may correspond to a lower portion of the auxiliary thin film transistor TFT'. For example, the bottom metal layer BML may be arranged between the auxiliary thin film transistor TFT' and the substrate 100. The bottom metal layer BML may prevent or substantially prevent external light from reaching the auxiliary thin film transistor TFT'. In some embodiments, a constant voltage or a signal may be applied to the bottom metal layer BML, and thus, damage to a pixel circuit due to electrostatic discharge may be prevented or substantially prevented.

The display element layer EDL may be covered by the thin film encapsulation layer TFEL, or may be covered by the sealing substrate. In some embodiments, the thin film encapsulation layer TFEL may include at least one inorganic encapsulation layer, and at least one organic encapsulation layer. For example, in an embodiment, as shown in FIG. 2, the thin film encapsulation layer TFEL may include first and second inorganic encapsulation layers 131 and 133, and an organic encapsulation layer 132 between the first and second inorganic encapsulation layers 131 and 133.

The first and second inorganic encapsulation layers 131 and 133 may include one or more inorganic insulating materials, for example, from among aluminum oxide, titanium oxide, tantalum oxide, hafnium oxide, zinc oxide, silicon oxide, silicon nitride, and silicon oxynitride. The organic encapsulation layer 132 may include a polymer-based material. Various examples of a suitable polymer-based material may include acryl-based resin, epoxy-based resin, polyimide, and polyethylene.

In some embodiments, when the display element layer EDL is sealed by a sealing substrate (e.g., rather than by the thin film encapsulation layer TFEL), the sealing substrate may face the substrate 100 with the display element layer EDL therebetween. In this case, there may be a gap between the sealing substrate and the display element layer EDL. The sealing substrate may include glass. A sealant including a frit and/or the like may be arranged between the substrate 100 and the sealing substrate, and the sealant may be arranged at (e.g., in or on) the peripheral area DPA described above. The sealant arranged at (e.g., in or on) the peripheral area DPA may prevent or substantially prevent lateral penetration of moisture while surrounding (e.g., around a periphery of) the display area DA.

The touchscreen layer TSL may obtain coordinate information according to an external input, for example, such as a touch event. The touchscreen layer TSL may include a touch electrode, and touch wires connected to the touch electrode. The touchscreen layer TSL may sense an external input in a self-capacitance manner or a mutual capacitance manner.

In some embodiments, the touchscreen layer TSL may be formed on (e.g., directly on) the thin film encapsulation layer TFEL. In other embodiments, the touchscreen layer TSL may be separately formed on a touch substrate, and then combined on the thin film encapsulation layer TFEL through an adhesive layer, for example, such as an optically clear adhesive (OCA). In an embodiment, the touchscreen layer TSL may be directly formed on the thin film encapsulation layer TFEL, and in this case, no adhesive layer may be arranged (e.g., may need to be arranged) between the touchscreen layer TSL and the thin film encapsulation layer TFEL.

The optical function layer OFL may include an anti-reflection layer. The anti-reflection layer may reduce reflectance of light (e.g., external light) incident from the outside toward the display apparatus 1.

In some embodiments, the optical function layer OFL may include (e.g., may be) a polarizing film. The optical function layer OFL may include an opening OFL_OP corresponding to the transmission area TA. Accordingly, light transmittance of the transmission area TA may be increased (e.g., may be significantly increased). The opening OFL_OP may be filled with a clear material, for example, such as an optically clear resin (OCR).

In some embodiments, the optical function layer OFL may include a filter plate including, for example, a black matrix and color filters.

In some embodiments, a cover window may be arranged on the display panel 10 to protect the display panel 10. The optical function layer OFL may be attached to the cover window with an OCA, or may be attached to the touchscreen layer TSL with an OCA.

The panel protection member PB may be attached to a lower portion (e.g., a lower surface) of the substrate 100, and thus, may support and protect the substrate 100. The panel protection member PB may include an opening PB_OP corresponding to the component area CA. As the panel protection member PB includes the opening PB_OP, light transmittance of the component area CA may be increased. The panel protection member PB may include polyethylene terephthalate (PET) or polyimide (PI).

An area of the component area CA may be larger than an area where the component 40 is arranged. Accordingly, an area of the opening PB_OP included in the panel protection member PB may not match (e.g., may not be the same size as) the area of the component area CA.

While FIG. 2 shows one component 40 arranged at (e.g., in or on) the component area CA, the present disclosure is not limited thereto, and a plurality of components 40 may be arranged at (e.g., in or on) the component area CA. In this case, at least two of the plurality of components 40 may have different functions from each other. For example, in some embodiments, the plurality of components 40 may include at least two from among a camera (e.g., an imaging device), a solar cell, a flash, a proximity sensor, an illuminance sensor, and an iris sensor.

Figure 3:
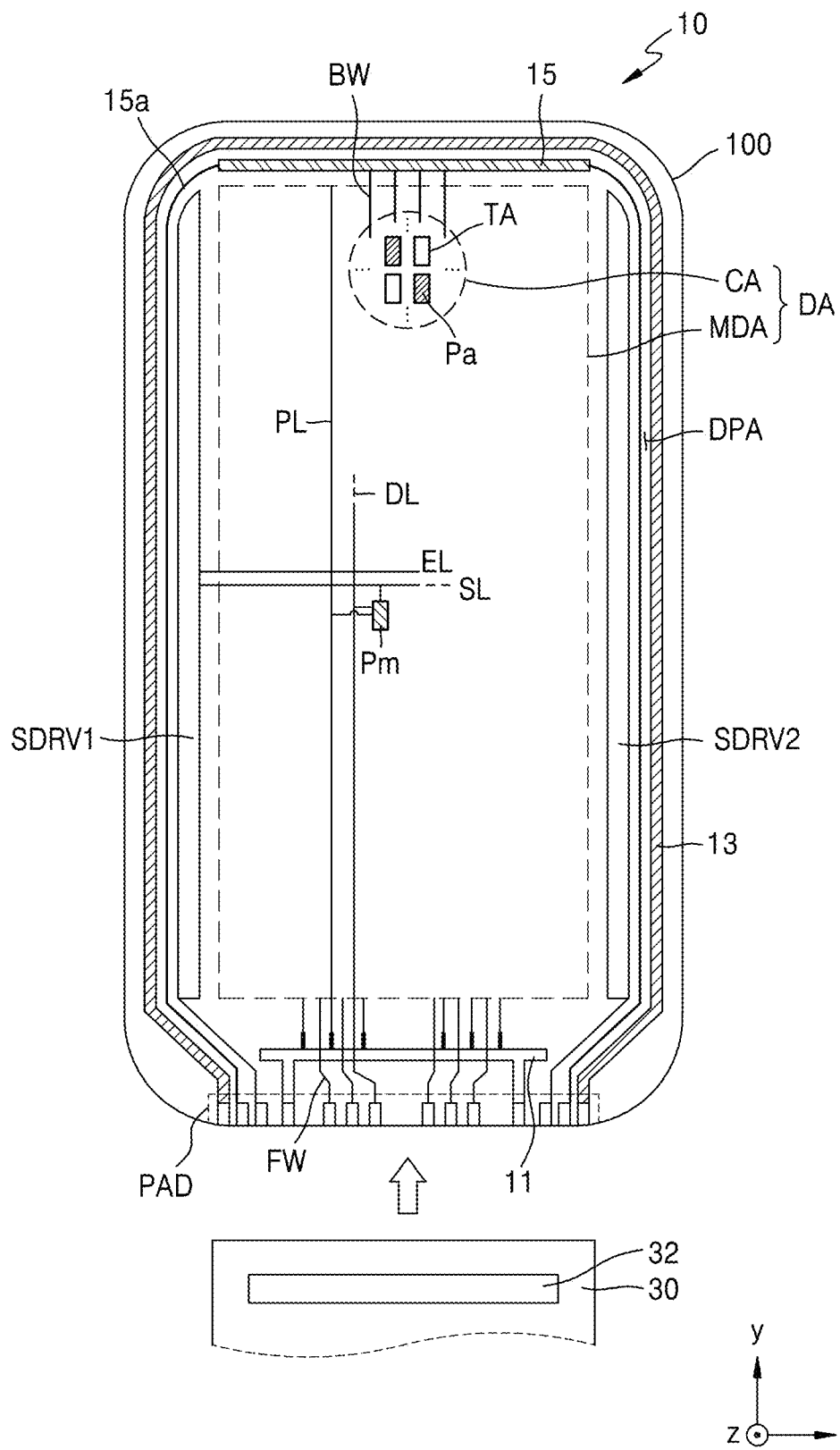
FIG. 3 is a schematic plan view of a display panel that may be included in the display apparatus of FIG. 1.

FIG. 3 is a schematic plan view of the display panel 10 according to an embodiment.

Referring to FIG. 3, various elements constituting the display panel 10 are arranged on the substrate 100. The substrate 100 includes the display area DA and the peripheral area DPA surrounding (e.g., around a periphery of) the display area DA. The display area DA includes the main display area MDA where a main image is displayed, and the component area CA including the transmission area TA and where an auxiliary image is displayed. The auxiliary image may form one entire image together with the main image, or the auxiliary image may be an image independent from (e.g., separate from) the main image.

The plurality of main sub-pixels Pm are arranged at (e.g., in or on) the main display area MDA. The plurality of main sub-pixels Pm may each be implemented by a display element, for example, such as an organic light-emitting diode OLED. Each main sub-pixel Pm may emit, for example, red light, green light, blue light, or white light. The main display area MDA may be covered by a sealing member and protected from external air and/or moisture.

As described above, the component area CA may be on one side of the main display area MDA, or may be arranged inside (e.g., within) the display area DA and surrounded (e.g., at least partially around a periphery thereof) by the main display area MDA. The plurality of auxiliary sub-pixels Pa are arranged at (e.g., in or on) the component area CA. The plurality of auxiliary sub-pixels Pa may each be implemented by a display element, for example, such as the organic light-emitting diode OLED. Each auxiliary sub-pixel Pa may emit, for example, red light, green light, blue light, or white light. The component area CA may be covered by a sealing member and protected from external air and/or moisture.

The component area CA may have the transmission area TA. In some embodiments, transmission area TA may surround (e.g., around a periphery of) the plurality of auxiliary sub-pixels Pa. In other embodiments, the transmission area TA may be arranged in a grid with the plurality of auxiliary sub-pixels Pa.

Because the component area CA has the transmission area TA, a resolution of the component area CA may be lower than that of the main display area MDA. For example, the resolution of the component area CA may be about ½, ⅜, ⅓, ¼, ⅖, ⅛, ⅑, 1/16, or the like of the resolution of the main display area MDA. For example, the resolution of the main display area MDA may be about 400 pixels per inch (ppi) or more, and the resolution of the component area CA may be about 200 ppi or about 100 ppi.

Pixel circuits configured to drive the main and auxiliary sub-pixels Pm and Pa may each be electrically connected to peripheral circuits arranged at (e.g., in or on) the peripheral area DPA. For example, a first scan driving circuit SDRV1, a second scan driving circuit SDRV2, a terminal portion PAD, a driving voltage supply line 11, and a common voltage supply line 13 may be arranged at (e.g., in or on) the peripheral area DPA. A bias voltage supply line 15 configured to apply a bias voltage to the bottom metal layer BML arranged at (e.g., in or on) the component area CA may be arranged at (e.g., in or on) the peripheral area DPA.

The first scan driving circuit SDRV1 may apply a scan signal to at least some of (e.g., to each of) the pixel circuits configured to drive the main and auxiliary sub-pixels Pm and Pa through a scan line SL. The first scan driving circuit SDRV1 may apply an emission control signal to at least some of (e.g., to each of) the pixel circuits through an emission control line EL. The second scan driving circuit SDRV2 may be arranged opposite to the first scan driving circuit SDRV1 with respect to the main display area MDA, and may be parallel to or substantially parallel to the first scan driving circuit SDRV1. Some of the pixel circuits of the main sub-pixels Pm of the main display area MDA may be electrically connected to the first scan driving circuit SDRV1, and others thereof may be electrically connected to the second scan driving circuit SDRV2. Some of the pixel circuits of the auxiliary sub-pixels Pa of the component area CA may be electrically connected to the first scan driving circuit SDRV1, and others thereof may be electrically connected to the second scan driving circuit SDRV2. However, the present disclosure is not limited thereto, and in some embodiments, the second scan driving circuit SDRV2 may be omitted.

The terminal portion PAD may be arranged on one side of the substrate 100. The terminal portion PAD may not be covered by an insulating layer, but may be exposed and connected to a display circuit board 30. A display driver 32 may be arranged on the display circuit board 30.

The display driver 32 may generate control signals, which are transmitted to the first scan driving circuit SDRV1 and the second scan driving circuit SDRV2. The display driver 32 may generate a data signal, and the generated data signal may be transmitted to the pixel circuits of the main and auxiliary sub-pixels Pm and Pa through a fan-out wire FW and a data line DL connected to the fan-out wire FW.

The display driver 32 may supply a driving voltage ELVDD to the driving voltage supply line 11, and may supply a common voltage ELVSS to the common voltage supply line 13. The driving voltage ELVDD may be applied to the pixel circuits of the main and auxiliary sub-pixels Pm and Pa through a driving voltage line PL connected to the driving voltage supply line 11, and the common voltage ELVSS may applied to an opposite electrode of a display element through the common voltage supply line 13.

The display driver 32 may supply a bias voltage to the bias voltage supply line 15. The bias voltage may be applied to the bottom metal layer BML (e.g., refer to FIG. 2) through a bias wire BW branched from the bias voltage supply line 15. In some embodiments, the bias wire BW may be formed on the same layer as that of the bias voltage supply line 15, and may be integrally provided with the bias voltage supply line 15. However, the present disclosure is not limited thereto, and in some embodiments, the bias wire BW may be formed on a different layer from that of the bias voltage supply line 15, and may be connected to the bias voltage supply line 15 through a contact hole. In some embodiments, the bias wire BW may extend in a −y-axis direction opposite to the +y-axis direction.

The bias voltage supply line 15 may be adjacent to the component area CA. For example, when the component area CA is arranged on an upper side of the display area DA, the bias voltage supply line 15 may extend in an x-axis direction at (e.g., in or on) the peripheral area DPA adjacent to the upper side of the display area DA. The bias voltage supply line 15 may be connected to the terminal portion PAD through a connection wire 15a arranged at (e.g., in or on) the peripheral area DPA, and may receive a bias voltage supplied from the display driver 32.

The driving voltage supply line 11 may extend in the x-axis direction on a lower side of the main display area MDA. The common voltage supply line 13 may have a shape in which one side is open in a loop shape, and thus, may partially surround (e.g., around a periphery of) the main display area MDA.

Figure 4A:
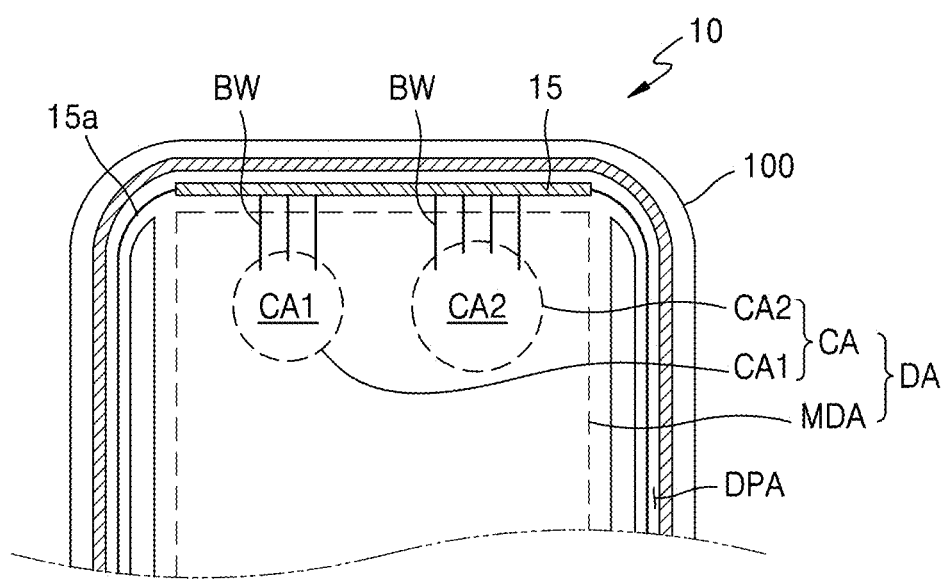
FIGS. 4A and 4B are schematic plan views of a portion of a display panel according to one or more embodiments.
Figure 4B:
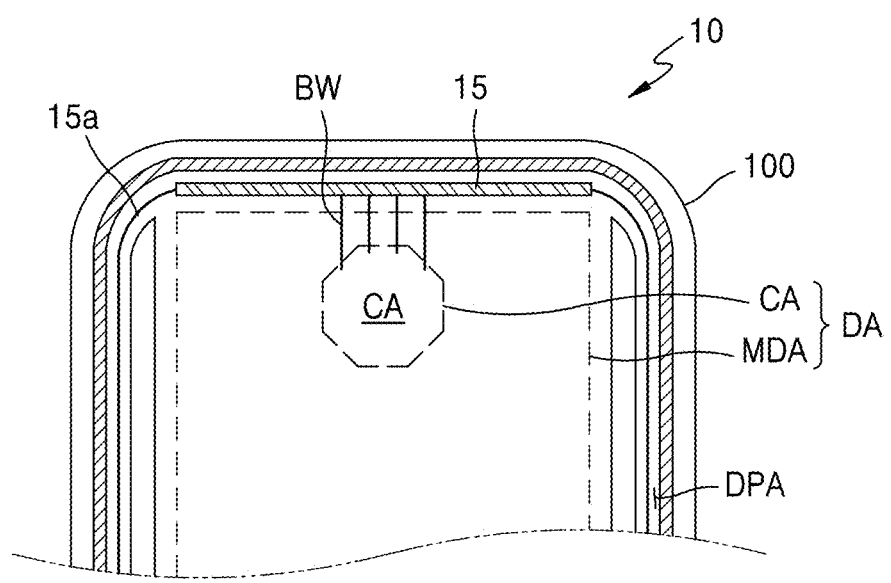

FIGS. 4A and 4B are schematic plan views of a portion of the display panel according to one or more embodiments.

Referring to FIG. 4A, a plurality of component areas CA may be provided. The component areas CA may include a first component area CA1 and a second component area CA2, which may be parallel to or substantially parallel to each other in the x-axis direction. In this case, the first component area CA1 and the second component area CA2 may be spaced apart from each other, and the first component area CA1 and the second component area CA2 may each be surrounded (e.g., around a periphery thereof) by the main display area MDA. In some embodiments, a first camera may correspond to the first component area CA1, and a second camera may correspond to the second component area CA2. In other embodiments, a camera may correspond to the first component area CA1, and an infrared sensor may correspond to the second component area CA2.

In some embodiments, sizes of the first component area CA1 and the second component area CA2 may be different from each other. In some embodiments, shapes of the first component area CA1 and the second component area CA2 may be different from each other.

The bias voltage supply line 15 may be arranged at (e.g., in or on) the peripheral area DPA adjacent to the first component area CA1 and the second component area CA2. The bias wire BW may connect the bias voltage supply line 15 and a bottom metal layer arranged at (e.g., in or on) the first component area CA1 and the second component area CA2 to each other.

Referring to FIG. 4B, the component area CA may have a polygonal shape. For example, the component area CA may have an octagonal shape as shown in FIG. 4B. However, the present disclosure is not limited thereto, and component area CA may have various suitable polygonal shapes, for example, such as a quadrilateral shape, a hexagonal shape, and/or the like. The component area CA may be surrounded (e.g., around a periphery thereof) by the main display area MDA.

The bias voltage supply line 15 may be arranged at (e.g., in or on) the peripheral area DPA adjacent to the component area CA. The bias wire BW may connect the bias voltage supply line 15 and a bottom metal layer arranged at (e.g., in or on) the component area CA to each other.

Figure 5:
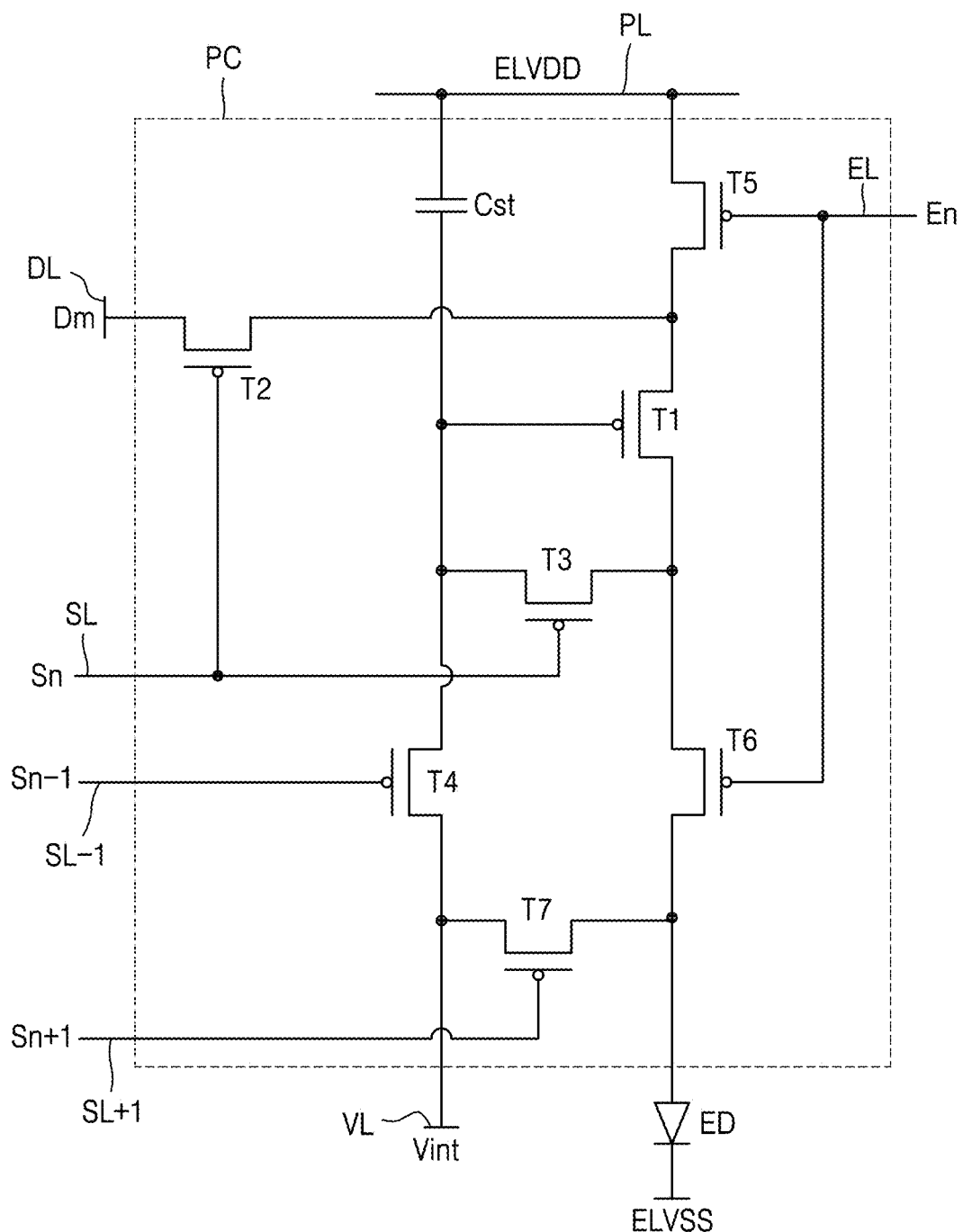
FIG. 5 is an equivalent circuit diagram of a pixel circuit configured to drive a sub-pixel according to an embodiment.

FIG. 5 is an equivalent circuit diagram of a pixel circuit PC configured to drive a sub-pixel according to an embodiment.

Referring to FIG. 5, the pixel circuit PC may include a driving thin film transistor T1, a switching thin film transistor T2, a compensation thin film transistor T3, a first initialization thin film transistor T4, an operation control thin film transistor T5, an emission control thin film transistor T6, a second initialization thin film transistor T7, and a storage capacitor Cst.

Although FIG. 5 shows each pixel circuit PC including an initialization voltage line VL, the driving voltage line PL, and various signal lines, for example, such as the scan line SL, a previous scan line SL−1, a next scan line SL+1, the emission control line EL, and the data line DL, the present disclosure is not limited thereto. For example, in another embodiment, at least one of the signal lines, for example, the scan line SL, the previous scan line SL−1, the next scan line SL+1, the emission control line EL, and/or the data line DL, and/or the initialization voltage line VL may be shared by neighboring (e.g., adjacent) pixel circuits.

A drain electrode of the driving thin film transistor T1 may be electrically connected to the light-emitting element ED via the emission control thin film transistor T6. The driving thin film transistor T1 receives a data signal Dm according to a switching operation of the switching thin film transistor T2, and supplies a driving current to the light-emitting element ED.

A gate electrode of the switching thin film transistor T2 is connected to the scan line SL, and a source electrode of the switching thin film transistor T2 is connected to the data line DL. A drain electrode of the switching thin film transistor T2 may be connected to a source electrode of the driving thin film transistor T1, and may also be connected to the driving voltage line PL via the operation control thin film transistor T5.

The switching thin film transistor T2 is turned on according to a scan signal Sn received through the scan line SL to perform a switching operation for transmitting the data signal Dm transmitted through the data line DL to the source electrode of the driving thin film transistor T1.

A gate electrode of the compensation thin film transistor T3 may be connected to the scan line SL. A source electrode of the compensation thin film transistor T3 may be connected to the drain electrode of the driving thin film transistor T1, and may also be connected to a pixel electrode of the light-emitting element ED via the emission control thin film transistor T6. A drain electrode of the compensation thin film transistor T3 may be connected to one electrode of the storage capacitor Cst, a source electrode of the first initialization thin film transistor T4, and a gate electrode of the driving thin film transistor T1. The compensation thin film transistor T3 is turned on according to the scan signal Sn received through the scan line SL to diode-connect the driving thin film transistor T1 by connecting the gate electrode and the drain electrode of the driving thin film transistor T1 to each other.

A gate electrode of the first initialization thin film transistor T4 may be connected to the previous scan line SL−1. A drain electrode of the first initialization thin film transistor T4 may be connected to the initialization voltage line VL. The source electrode of the first initialization thin film transistor T4 may be connected to the one electrode of the storage capacitor Cst, the drain electrode of the compensation thin film transistor T3, and the gate electrode of the driving thin film transistor T1. The first initialization thin film transistor T4 may be turned on according to a previous scan signal Sn−1 received through the previous scan line SL−1 to perform an initialization operation for initializing a voltage of the gate electrode of the driving thin film transistor T1 by transmitting an initialization voltage Vint to the gate electrode of the driving thin film transistor T1.

A gate electrode of the operation control thin film transistor T5 may be connected to the emission control line EL. A source electrode of the operation control thin film transistor T5 may be connected to the driving voltage line PL. A drain electrode of the operation control thin film transistor T5 may be connected to the source electrode of the driving thin film transistor T1 and the drain electrode of the switching thin film transistor T2.

A gate electrode of the emission control thin film transistor T6 may be connected to the emission control line EL. A source electrode of the emission control thin film transistor T6 may be connected to the drain electrode of the driving thin film transistor T1 and the source electrode of the compensation thin film transistor T3. A drain electrode of the emission control thin film transistor T6 may be electrically connected to the pixel electrode of the light-emitting element ED. As the operation control thin film transistor T5 and the emission control thin film transistor T6 are turned on (e.g., concurrently or simultaneously turned on) according to an emission control signal En received through the emission control line EL, the driving voltage ELVDD is transmitted to the light-emitting element ED, and thus, the driving current may flow through the light-emitting element ED.

A gate electrode of the second initialization thin film transistor T7 may be connected to the next scan line SL+1. A source electrode of the second initialization thin film transistor T7 may be connected to the pixel electrode of the light-emitting element ED. A drain electrode of the second initialization thin film transistor T7 may be connected to the initialization voltage line VL. The second initialization thin film transistor T7 may be turned on according to a next scan signal Sn+1 received through the next scan line SL+1 to initialize the pixel electrode of the light-emitting element ED.

Although FIG. 5 shows that the first initialization thin film transistor T4 and the second initialization thin film transistor T7 are connected to the previous scan line SL−1 and the next scan line SL+1, respectively, the present disclosure is not limited thereto. For example, in another embodiment, the first initialization thin film transistor T4 and the second initialization thin film transistor T7 may both be connected to the previous scan line SL−1, and may each be driven according to the previous scan signal Sn−1.

Another electrode of the storage capacitor Cst may be connected to the driving voltage line PL. The one electrode of the storage capacitor Cst may be connected to the gate electrode of the driving thin film transistor T1, the drain electrode of the compensation thin film transistor T3, and the source electrode of the first initialization thin film transistor T4.

An opposite electrode (for example, a cathode) of the light-emitting element ED receives the common voltage ELVSS. The light-emitting element ED receives the driving current from the driving thin film transistor T1 and emits light.

However, the present disclosure is not limited to the pixel circuit PC shown in FIG. 5. For example, the pixel circuit PC is not limited to the number and circuit design of the thin film transistors and the storage capacitor shown and described with reference to FIG. 5, and the number and the circuit design may be variously modified. The pixel circuits PC configured to drive the main sub-pixels Pm may be the same or substantially the same as (e.g., may have the same or substantially the same circuit structure as) or may be different from the pixel circuits PC configured to drive the auxiliary sub-pixels Pa.

Figure 6:
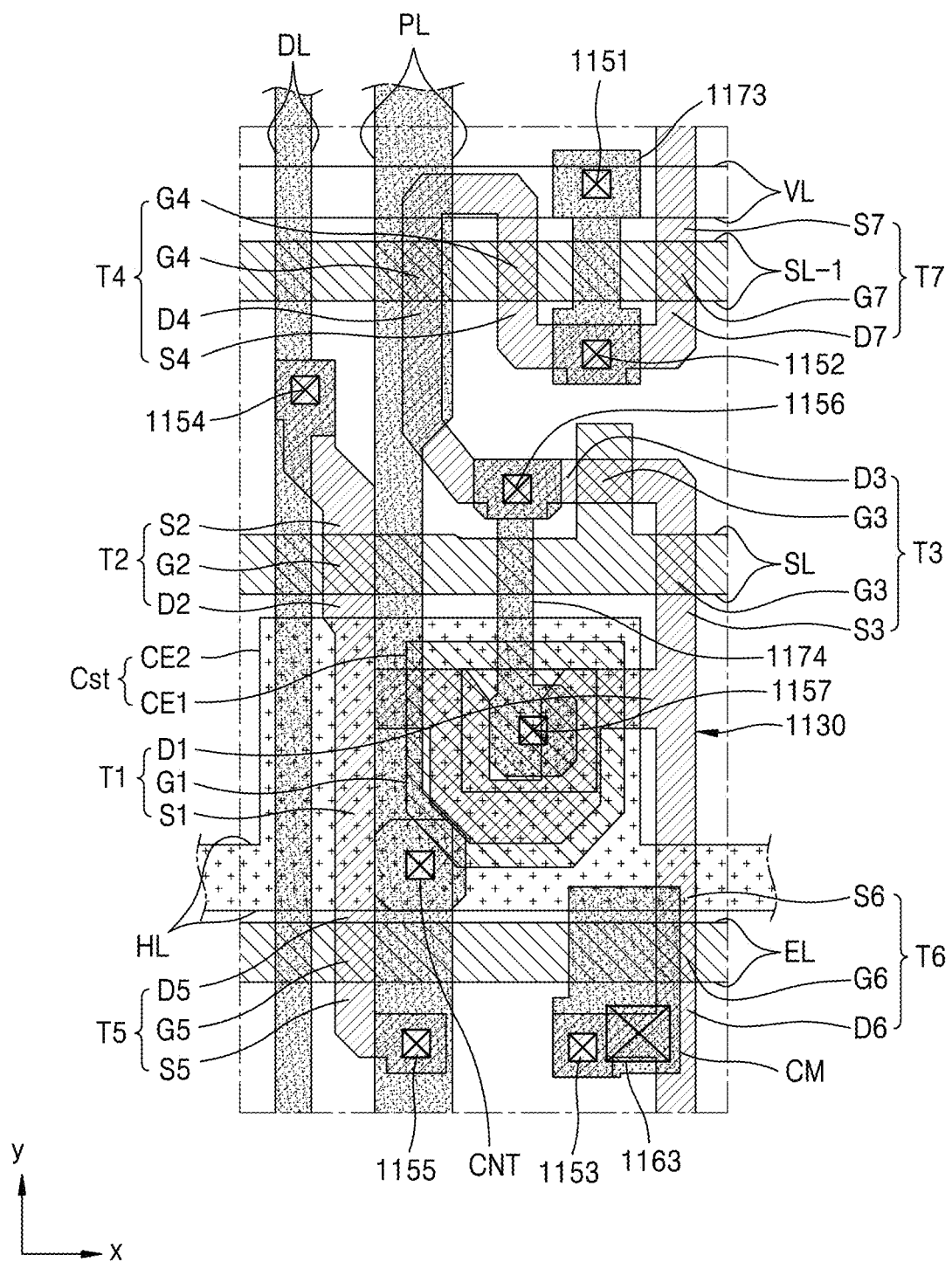
FIG. 6 is a plan view of a pixel circuit of a pixel according to an embodiment.

FIG. 6 is a plan view of a pixel circuit of a pixel according to an embodiment.

Referring to FIG. 6, the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 are arranged along a semiconductor layer 1130. The semiconductor layer 1130 is arranged over a substrate on which a buffer layer including an inorganic insulating material is formed.

Some areas of the semiconductor layer 1130 correspond to semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7. In other words, the semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 may be connected to one another and may be curved in various shapes.

The semiconductor layer 1130 includes a channel region, and a source region and a drain region on opposite sides of the channel region. The source region and the drain region may be understood as corresponding to a source electrode and a drain electrode, respectively, of a corresponding thin film transistor. For convenience, the source region and the drain region are hereinafter referred to as the source electrode and the drain electrode, respectively.

The driving thin film transistor T1 includes a driving gate electrode G1 overlapping with a driving channel region, and a driving source electrode S1 and a driving drain electrode D1 on opposite sides of the driving channel region. The driving channel region overlapping with the driving gate electrode G1 may have a bent shape, for example, such as an omega shape, thereby forming a long channel length in a narrow space. When the driving channel region is long, a driving range of a gate voltage may be widened, and thus, gradation of light emitted from the organic light-emitting diode OLED, which is a light-emitting element, may be controlled more precisely, and display quality may be improved.

The switching thin film transistor T2 includes a switching gate electrode G2 overlapping with a switching channel region, and a switching source electrode S2 and a switching drain electrode D2 on opposite sides of the switching channel region. The switching drain electrode D2 may be connected to the driving source electrode S1.

The compensation thin film transistor T3, which may be a dual thin film transistor, may include a plurality of compensation gate electrodes G3 overlapping with two compensation channel regions, respectively, and may include a compensation source electrode S3 and a compensation drain electrode D3 arranged on opposite sides of the compensation channel regions. The compensation thin film transistor T3 may be connected to the driving gate electrode G1 of the driving thin film transistor T1 through a node connection line 1174 described in more detail below.

The first initialization thin film transistor T4, which may be a dual thin film transistor, may include a plurality of first initialization gate electrodes G4 overlapping with two first initialization channel regions, respectively, and may include a first initialization source electrode S4 and a first initialization drain electrode D4 arranged on opposite sides of the first initialization channel regions.

The operation control thin film transistor T5 may include an operation control gate electrode G5 overlapping with an operation control channel region, and an operation control source electrode S5 and an operation control drain electrode D5 arranged on opposite sides thereof. The operation control drain electrode D5 may be connected to the driving source electrode S1.

The emission control thin film transistor T6 may include an emission control gate electrode G6 overlapping with an emission control channel region, and an emission control source electrode S6 and an emission control drain electrode D6 arranged on opposite sides thereof. The emission control source electrode S6 may be connected to the driving drain electrode D1.

The second initialization thin film transistor T7 may include a second initialization gate electrode G7 overlapping with a second initialization channel region, and a second initialization source electrode S7 and a second initialization drain electrode D7 arranged on opposite sides thereof.

The thin film transistors described above may be connected to the initialization voltage line VL, the driving voltage line PL, and various signal lines, for example, the scan line SL, the previous scan line SL−1, the emission control line EL, and the data line DL.

The scan line SL, the previous scan line SL−1, the emission control line EL, and the driving gate electrode G1 may be arranged over the semiconductor layer 1130 described above with an insulating layer (e.g., one or more insulating layers) therebetween.

The scan line SL may extend in the x-axis direction. Some areas of the scan line SL may correspond to the switching and compensation gate electrodes G2 and G3, respectively. For example, areas of the scan line SL overlapping with the channel regions of the switching and compensation thin film transistors T2 and T3 may correspond to (e.g., may be) the switching and compensation gate electrodes G2 and G3, respectively.

The previous scan line SL−1 may extend in the x-axis direction, and some areas thereof may correspond to the first and second initialization gate electrodes G4 and G7, respectively. For example, areas of the previous scan line SL−1 overlapping with the channel regions of the first and second initialization thin film transistors T4 and T7 may correspond to (e.g., may be) the first and second initialization gate electrodes G4 and G7, respectively.

The emission control line EL extends in the x-axis direction. Some areas of the emission control line EL may correspond to the operation control and emission control gate electrodes G5 and G6, respectively. For example, areas of the emission control line EL overlapping with the channel regions of the operation control and emission control thin film transistors T6 and T7 may correspond to (e.g., may be) the operation control and emission control gate electrodes G5 and G6, respectively.

The driving gate electrode G1, which is a floating electrode, may be connected to the compensation thin film transistor T3 through the node connection line 1174 described in more detail below.

An electrode voltage line HL may be arranged over the scan line SL, the previous scan line SL−1, the emission control line EL, and the driving gate electrode G1 described above with an insulating layer (e.g., one or more insulating layers) therebetween.

The electrode voltage line HL may extend in the x-axis direction to cross the data line DL and the driving voltage line PL. A portion of the electrode voltage line HL may cover at least a portion of the driving gate electrode G1, and may constitute the storage capacitor Cst together with the driving gate electrode G1. For example, the driving gate electrode G1 may correspond to (e.g., may be) a lower electrode CE1 of the storage capacitor Cst, and a portion of the electrode voltage line HL may correspond to (e.g., may be) an upper electrode CE2 of the storage capacitor Cst.

The upper electrode CE2 of the storage capacitor Cst is electrically connected to the driving voltage line PL. In this regard, the electrode voltage line HL may be connected to the driving voltage line PL arranged over the electrode voltage line HL through a contact hole CNT. Accordingly, the electrode voltage line HL may have the same or substantially the same voltage level (e.g., a constant voltage) as that of the driving voltage line PL. For example, the electrode voltage line HL may have a constant voltage of +5V. The electrode voltage line HL may be understood as a transverse driving voltage line.

Because the driving voltage line PL extends in a y-axis direction, and the electrode voltage line HL electrically connected to the driving voltage line PL extends in the x-axis direction crossing the y-axis direction, a plurality of driving voltage lines PL and electrode voltage lines HL may constitute a mesh structure at (e.g., in or on) a display area.

The data line DL, the driving voltage line PL, an initialization connection line 1173, and the node connection line 1174 may be arranged over the electrode voltage line HL with an insulating layer (e.g., one or more insulating layers) therebetween.

The data line DL extends in the y-axis direction, and may be connected to the switching source electrode S2 of the switching thin film transistor T2 through a contact hole 1154. A portion of the data line DL may be understood as (e.g., may correspond to) the switching source electrode S2.

The driving voltage line PL extends in the y-axis direction, and as described above, is connected to the electrode voltage line HL through the contact hole CNT. Further, the driving voltage line PL may be connected to the operation control thin film transistor T5 through a contact hole 1155. For example, the driving voltage line PL may be connected to the operation control source electrode S5 through the contact hole 1155.

One end of the initialization connection line 1173 may be connected to the first and second initialization thin film transistors T4 and T7 through a contact hole 1152, and the other end may be connected to the initialization voltage line VL described in more detail below through a contact hole 1151.

One end of the node connection line 1174 may be connected to the compensation drain electrode D3 through a contact hole 1156, and the other end may be connected to the driving gate electrode G1 through a contact hole 1157.

The initialization voltage line VL may be arranged over the data line DL, the driving voltage line PL, the initialization connection line 1173, and the node connection line 1174 with an insulating layer (e.g., one or more insulating layers) therebetween.

The initialization voltage line VL extends in the x-axis direction. The initialization voltage line VL may be connected to the first and second initialization thin film transistors T4 and T7 through the initialization connection line 1173. The initialization voltage line VL may have a constant voltage (for example, −2V).

The initialization voltage line VL may be arranged on the same layer as that of a pixel electrode 121 (e.g., refer to FIG. 9) of the organic light-emitting diode OLED, and may include the same or substantially the same material as that of the pixel electrode 121 of the organic light-emitting diode OLED. The pixel electrode 121 may be connected to the emission control thin film transistor T6. The pixel electrode 121 may be connected to a connection electrode CM through a contact hole 1163, and the connection electrode CM may be connected to the emission control drain electrode D6 through a contact hole 1153.

The initialization voltage line VL that is arranged on the same layer as that of the pixel electrode 121 has been described with reference to FIG. 6. However, the present disclosure is not limited thereto, and in another embodiment, the initialization voltage line VL may be arranged on the same layer as that of the electrode voltage line HL.

Figure 7:
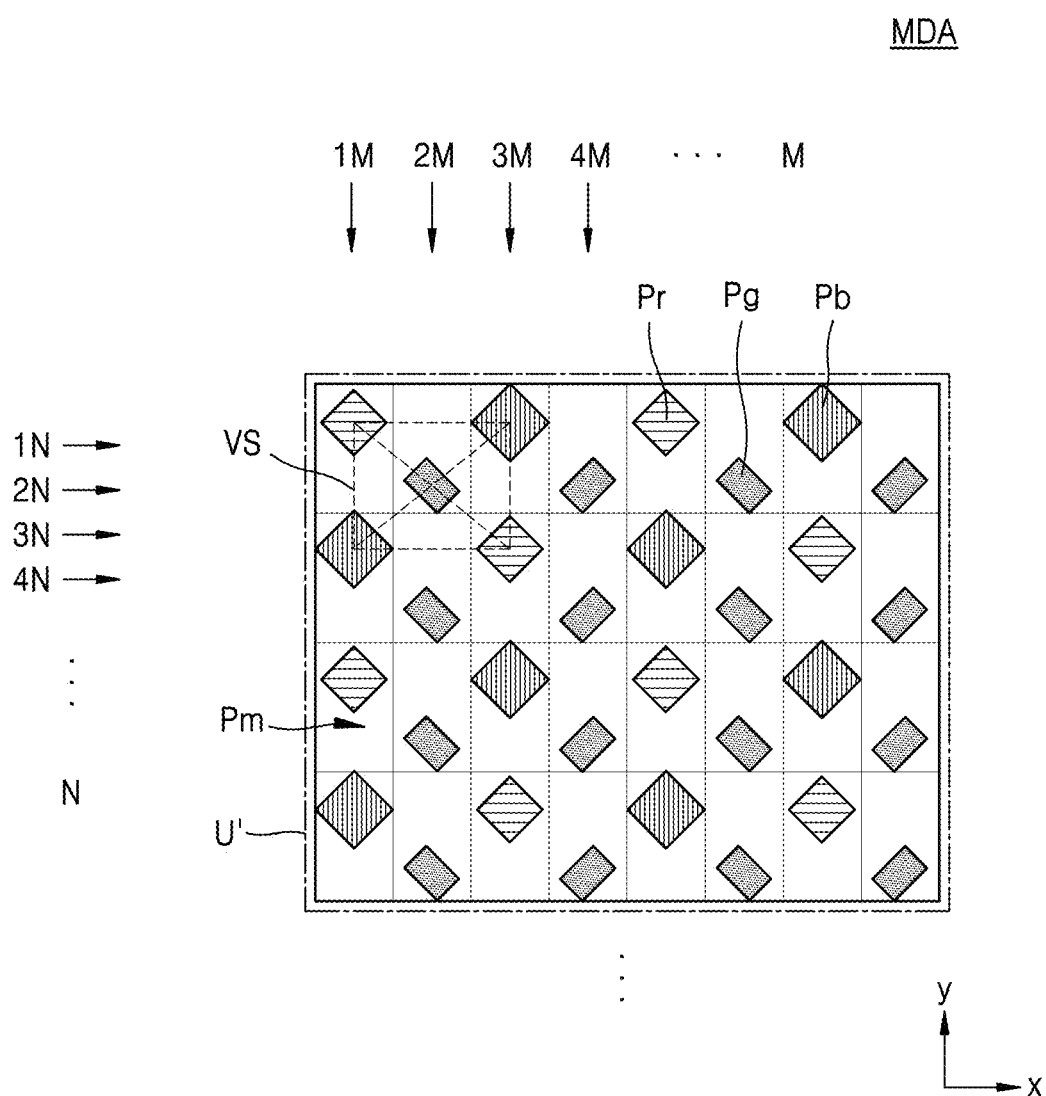
FIG. 7 is a schematic layout diagram of a pixel arrangement structure in a main display area according to an embodiment.

FIG. 7 is a schematic layout diagram of a pixel arrangement structure in the main display area MDA according to an embodiment.

The plurality of main sub-pixels Pm may be arranged at (e.g., in or on) the main display area MDA. A sub-pixel described herein refers to an emission area as a minimum unit for implementing an image. When an organic light-emitting diode is employed as a display element, the emission area may be defined by an opening of a pixel-defining layer, which will be described in more detail below.

As shown in FIG. 7, the main sub-pixels Pm arranged at (e.g., in or on) the main display area MDA may be arranged in a PenTile structure. A red sub-pixel Pr, a green sub-pixel Pg, and a blue sub-pixel Pb may implement red, green, and blue colors, respectively.

A plurality of red sub-pixels Pr and a plurality of blue sub-pixels Pb are alternately arranged in a first row 1N, a plurality of green sub-pixels Pg are spaced apart at suitable intervals (e.g., certain intervals or predetermined intervals) in an adjacent second row 2N, the blue sub-pixels Pb and the red sub-pixels Pr are alternately arranged in an adjacent third row 3N, the plurality of green sub-pixels Pg are spaced apart at suitable intervals (e.g., certain intervals or predetermined intervals) in an adjacent fourth row 4N, and such an arrangement of pixels may be repeated until an $N^{th}$ row (where N is a natural number). In this regard, the blue sub-pixel Pb and the red sub-pixel Pr may be larger than the green sub-pixel Pg.

The plurality of red sub-pixels Pr and the plurality of blue sub-pixels Pb arranged in the first row 1N, and the plurality of green sub-pixels Pg arranged in the second row 2N may be staggered with respect to each other. Accordingly, the red sub-pixel Pr and the blue sub-pixel Pb are alternately arranged in a first column 1M, the plurality of green sub-pixels Pg are spaced apart at suitable intervals (e.g., certain intervals or predetermined intervals) in an adjacent second column 2M, the blue sub-pixel Pb and the red sub-pixel Pr are alternately arranged in an adjacent third column 3M, the plurality of green sub-pixels Pg are spaced apart at suitable intervals (e.g., certain intervals or predetermined intervals) in an adjacent fourth column 4M, and such an arrangement of pixels may be repeated until an $M^{th}$ column (where M is a natural number).

In other words, in the pixel arrangement described above, the red sub-pixels Pr are arranged on first and third vertices facing each other from among vertices of a virtual quadrilateral VS having a center point at the green sub-pixel Pg as the center point of the quadrilateral, and the blue sub-pixels Pb are arranged on second and fourth vertices, which are the other vertices of the virtual quadrilateral VS. In this regard, the virtual quadrilateral VS may be variously modified into a rectangle, a rhombus, a square, and/or the like.

The above described pixel arrangement structure may be referred to as a PenTile matrix structure or a PenTile structure, and a high resolution may be implemented with a small number of pixels by applying rendering driving that expresses colors by sharing adjacent pixels.

Although FIG. 7 shows the plurality of main sub-pixels Pm that are arranged in a PenTile matrix structure, the present disclosure is not limited thereto. For example, the plurality of main sub-pixels Pm may be arranged in various suitable shapes and structures, for example, such as a stripe structure, a mosaic arrangement structure, a delta arrangement structure, and/or the like.

Figure 8A:
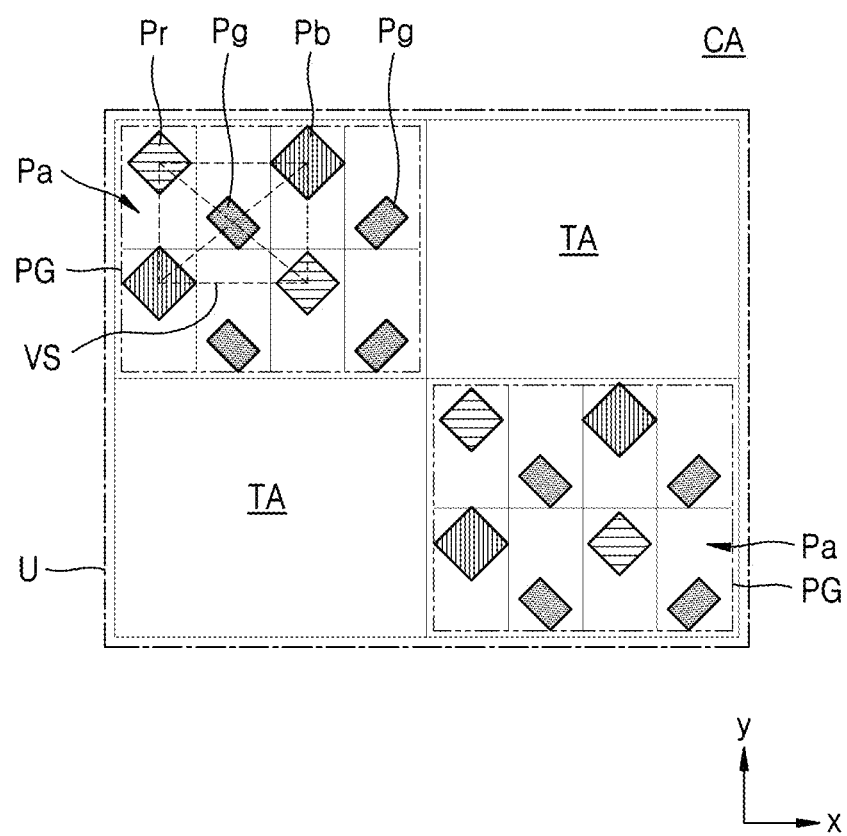
FIGS. 8A and 8B are schematic layout diagrams of a pixel arrangement structure in a component area according to embodiments.
Figure 8B:
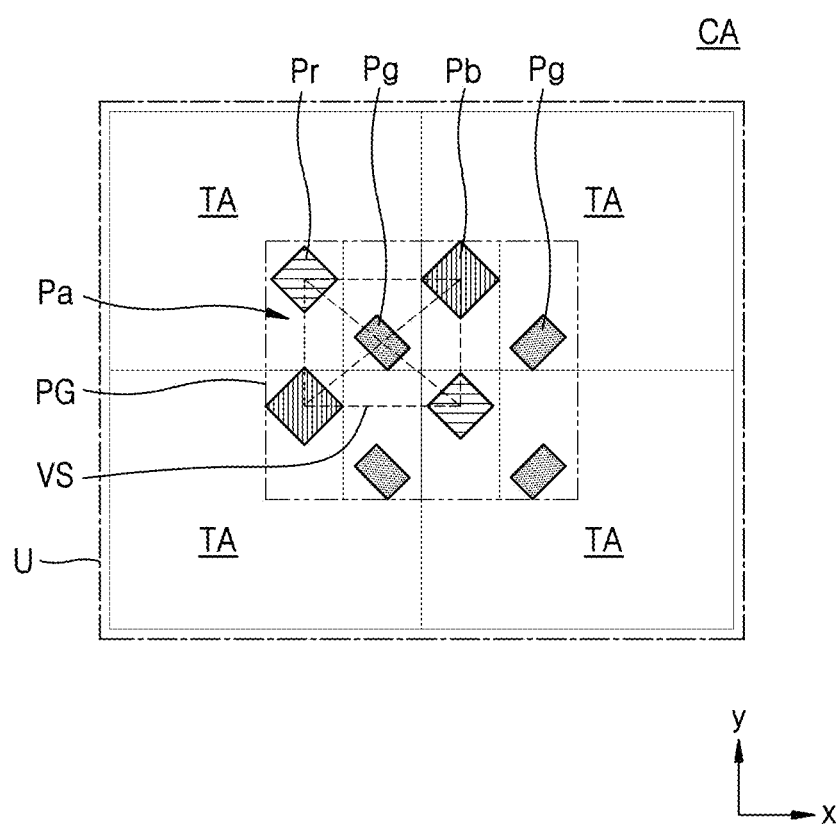

FIGS. 8A and 8B are schematic layout diagrams of a pixel arrangement structure in the component area CA according to one or more embodiments.

Referring to FIG. 8A, the plurality of auxiliary sub-pixels Pa may be arranged at (e.g., in or on) the component area CA. The auxiliary sub-pixels Pa may each emit one of red light, green light, blue light, and white light.

The component area CA may include a pixel group PG including at least one auxiliary sub-pixel Pa, and the transmission area TA. The pixel group PG and the transmission area TA are alternately arranged in the x-axis direction and the y-axis direction, and for example, may be arranged in a grid. In this case, the component area CA may include a plurality of pixel groups PG and a plurality of transmission areas TA.

The pixel group PG may be defined as a collection of sub-pixels in which the plurality of auxiliary sub-pixels Pa are grouped in a unit area (e.g., a predefined or preset unit area). For example, as shown in FIG. 8A, one pixel group PG may include eight auxiliary sub-pixels Pa arranged in a PenTile structure. In other words, one pixel group PG may include two red sub-pixels Pr, four green sub-pixels Pg, and two blue sub-pixels Pb.

In the component area CA, a basic unit U, in which a certain number of pixel groups PG and a certain number of transmission areas TA are grouped, may be repeatedly arranged in the x-axis direction and the y-axis direction. In FIG. 8A, the basic unit U may have a shape and arrangement in which two pixel groups PG and two transmission areas TA are arranged adjacent to one another and are grouped in a quadrilateral shape. As used herein, the basic unit U refers to a division of repetitive shapes, and does not refer to a disconnection of configurations.

As shown in FIG. 7, the main display area MDA may have a corresponding unit U'. The corresponding unit U' may have the same or substantially the same area (e.g., the same or substantially the same size) as that of the basic unit U. In this case, the number of main sub-pixels Pm included in the corresponding unit U' may be greater than the number of auxiliary sub-pixels Pa included in the basic unit U. For example, in some embodiments, the number of auxiliary sub-pixels Pa and the number of main sub-pixels Pm arranged per a unit area (e.g., per the same unit area size) may be provided at a ratio of 1:2. In this case, when the number of auxiliary sub-pixels Pa included in the basic unit U is 16, the number of main sub-pixels Pm included in the corresponding unit U' may be 32.

As shown in FIG. 8A, a pixel arrangement structure of the component area CA, in which an arrangement structure of the auxiliary sub-pixels Pa is a PenTile structure, and the resolution thereof is ½ of that of the main display area MDA, may be referred to as a ½ PenTile structure. However, the present disclosure is not limited thereto, and the number and/or arrangement of the auxiliary sub-pixels Pa included in the pixel group PG may be variously modified according to a desired resolution of the component area CA.

Referring to FIG. 8B, a pixel arrangement structure of the component area CA may have a ¼ PenTile structure. For example, as shown in FIG. 8B, eight auxiliary sub-pixels Pa may be arranged in a PenTile structure in the pixel group PG, and one pixel group PG may be included in the basic unit U. In this case, the remaining area of the basic unit U may be provided as the transmission area TA. Accordingly, in some embodiments, the number of auxiliary sub-pixels Pa and the number of main sub-pixels Pm arranged per unit area (e.g., per the same unit area size) may be provided at a ratio of 1:4. In this case, one pixel group PG may be surrounded (e.g., around a periphery thereof) by the transmission area TA.

Although FIGS. 8A and 8B show that the plurality of auxiliary sub-pixels Pa are arranged in a PenTile matrix structure, the present disclosure is not limited thereto. For example, the plurality of auxiliary sub-pixels Pa may be arranged in various suitable shapes and structures, for example, such as a stripe structure, a mosaic arrangement structure, a delta arrangement structure, and/or the like.

Further, although FIGS. 8A and 8B show that the auxiliary sub-pixel Pa has the same or substantially the same size as that of a corresponding main sub-pixel Pm of FIG. 7, the present disclosure is not limited thereto. For example, a size of the auxiliary sub-pixel Pa may be larger than that of the main sub-pixel Pm that emits the same color light as that of the auxiliary sub-pixel Pa. For a non-limiting example, a size of the blue sub-pixel Pb of the auxiliary sub-pixel Pa may be larger than that of the blue sub-pixel Pb of the main sub-pixel Pm. The difference in sizes may be designed by taking into account a difference in luminance and/or resolution between the component area CA and the main display area MDA.

Figure 9:
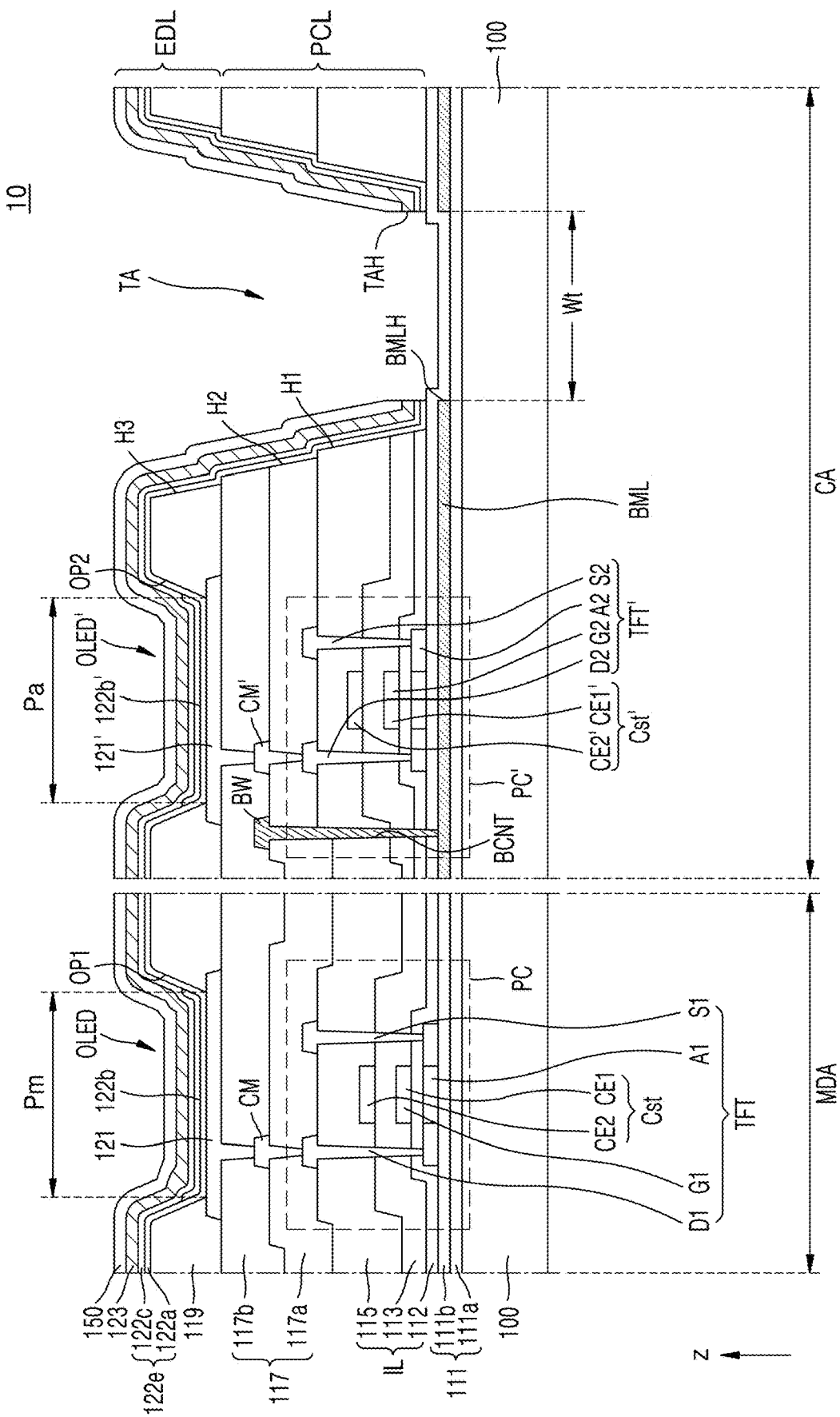
FIG. 9 is a schematic cross-sectional view of a portion of a display panel according to an embodiment, and schematically shows a main display area and a component area.

FIG. 9 is a schematic cross-sectional view of a portion of the display panel 10 according to an embodiment, and schematically shows the main display area MDA and the component area CA.

Referring to FIG. 9, the display panel 10 includes the main display area MDA and the component area CA. The main sub-pixel Pm is arranged at (e.g., in or on) the main display area MDA, and the component area CA includes the auxiliary sub-pixel Pa and the transmission area TA. A main pixel circuit PC and a main organic light-emitting diode OLED may be arranged at (e.g., in or on) the main display area MDA. The main pixel circuit PC may include a main thin film transistor TFT and a main storage capacitor Cst, and the main organic light-emitting diode OLED may be a display element connected to the main pixel circuit PC. An auxiliary pixel circuit PC' and an auxiliary organic light-emitting diode OLED' may be arranged at (e.g., in or on) the component area CA. The auxiliary pixel circuit PC' may include an auxiliary thin film transistor TFT' and an auxiliary storage capacitor Cst', and the auxiliary organic light-emitting diode OLED' may be a display element connected to the auxiliary pixel circuit PC'.

In FIG. 9, a case where the organic light-emitting diode is employed as the display element is illustrated. However, the present disclosure is not limited thereto, and in other embodiments, an inorganic light-emitting element or a quantum dot light-emitting element may be employed as the display element.

Hereinafter, a structure in which components, layers, and/or elements included in the display panel 10 are stacked will be described. The display panel 10 may include the substrate 100, a buffer layer 111, the circuit layer PCL, the display element layer EDL, the sealing member ENCM, and the optical function layer OFL stacked on one another.

As described above, the substrate 100 may include an insulating material such as, for example, glass, quartz, or polymer resin. The substrate 100 may be a rigid substrate or a flexible substrate capable of being bent, folded, rolled, and/or the like.

The buffer layer 111 may be arranged on the substrate 100 to decrease or prevent penetration of foreign materials, moisture, and/or external air from the bottom of the substrate 100, and to provide a flat or substantially flat surface on the substrate 100. The buffer layer 111 may include an inorganic material, for example, such as an oxide or a nitride, an organic material, or an organic-inorganic complex material, and may have a single-layer structure or a multilayered structure of an inorganic material and an organic material. In some embodiments, a barrier layer for preventing or substantially preventing penetration of external air may be further included between the substrate 100 and the buffer layer 111. In some embodiments, the buffer layer 111 may include silicon oxide ($SiO_2$) or silicon nitride ($SiN_X$). The buffer layer 111 may include a first buffer layer 111a and a second buffer layer 111b that are stacked on each other.

In some embodiments, at (e.g., in or on) the component area CA, the bottom metal layer BML may be arranged between the first buffer layer 111a and the second buffer layer 111b. In another embodiment, the bottom metal layer BML may be arranged between the substrate 100 and the first buffer layer 111a. The bottom metal layer BML may be arranged below the auxiliary pixel circuit PC' to prevent or substantially prevent characteristics of the auxiliary thin film transistor TFT' from being degraded due to light emitted from a component, and/or the like. Further, the bottom metal layer BML may prevent or substantially prevent light emitted from a component, and/or the like, and/or light travelling toward a component from diffracting through a narrow gap between wires connected to the auxiliary pixel circuit PC'. The bottom metal layer BML may not be present at (e.g., in or on) the transmission area TA.

The bottom metal layer BML may be connected to the bias wire BW arranged on a different layer therefrom through a contact hole. The bottom metal layer BML may receive a constant or substantially constant voltage or a signal from the bias wire BW. For example, the bottom metal layer BML may receive a bias voltage. In some embodiments, the bias voltage may have a different level from that of the driving voltage ELVDD. However, the present disclosure is not limited thereto, and in other embodiments, the bias voltage may have the same or substantially the same level as that of the driving voltage ELVDD.

As the bottom metal layer BML receives the bias voltage, a probability of electrostatic discharge may be reduced (e.g., may be significantly reduced). In some embodiments, the bottom metal layer BML may include, for example, aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The bottom metal layer BML may include a single layer or multiple layers of one or more of the materials described above.

The circuit layer PCL is arranged on the buffer layer 111, and may include the main and auxiliary pixel circuits PC and PC', a first gate insulating layer 112, a second gate insulating layer 113, an interlayer insulating layer 115, and a planarization layer 117. The main pixel circuit PC may include the main thin film transistor TFT and the main storage capacitor Cst, and the auxiliary pixel circuit PC' may include the auxiliary thin film transistor TFT' and the auxiliary storage capacitor Cst'.

The main thin film transistor TFT and the auxiliary thin film transistor TFT' may be arranged on the buffer layer 111. The main thin film transistor TFT includes a first semiconductor layer A1, a first gate electrode G1, a first source electrode S1, and a first drain electrode D1. The auxiliary thin film transistor TFT' includes a second semiconductor layer A2, a second gate electrode G2, a second source electrode S2, and a second drain electrode D2. The main thin film transistor TFT may be connected to the main organic light-emitting diode OLED, and thus, may drive the main organic light-emitting diode OLED. The auxiliary thin film transistor TFT' may be connected to the auxiliary organic light-emitting diode OLED', and thus, may drive the auxiliary organic light-emitting diode OLED'.

In some embodiments, the first semiconductor layer A1 and the second semiconductor layer A2 are arranged on the buffer layer 111, and may include polysilicon. In another embodiment, the first semiconductor layer A1 and the second semiconductor layer A2 may include amorphous silicon. In another embodiment, the first semiconductor layer A1 and the second semiconductor layer A2 may include an oxide of at least one material selected from the group including indium (In), gallium (Ga), stannum (Sn), zirconium (Zr), vanadium (V), hafnium (Hf), cadmium (Cd), germanium (Ge), chromium (Cr), titanium (Ti), and zinc (Zn). The first semiconductor layer A1 and the second semiconductor layer A2 may include a channel region, and source and drain regions doped with impurities.

The second semiconductor layer A2 may overlap with the bottom metal layer BML with the second buffer layer 111b therebetween. In an embodiment, a width of the second semiconductor layer A2 may be less than that of the bottom metal layer BML, and accordingly, when projected in a direction vertical to the substrate 100 (e.g., when viewed in a plan view), the second semiconductor layer A2 may entirely overlap with the bottom metal layer BML.

The first gate insulating layer 112 may cover the first semiconductor layer A1 and the second semiconductor layer A2. The first gate insulating layer 112 may include an inorganic insulating material, for example, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may include a single layer or multiple layers including one or more of the inorganic insulating materials described above.

The first gate electrode G1 and the second gate electrode G2 are arranged on the first gate insulating layer 112 to overlap with the first semiconductor layer A1 and the second semiconductor layer A2, respectively. The first gate electrode G1 and the second gate electrode G2 may include molybdenum (Mo), aluminum (Al), copper (Cu), titanium (Ti), and/or the like, and may include a single layer or multiple layers. As an example, the first gate electrode G1 and the second gate electrode G2 may include a single layer of molybdenum (Mo).

The second gate insulating layer 113 may cover the first gate electrode G1 and the second gate electrode G2. The second gate insulating layer 113 may include an inorganic insulating material, for example, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulating layer 113 may include a single layer or multiple layers including one or more of the inorganic insulating materials described above.

A first upper electrode CE2 of the main storage capacitor Cst and a second upper electrode CE2' of the auxiliary storage capacitor Cst' may be arranged on the second gate insulating layer 113.

At (e.g., in or on) the main display area MDA, the first upper electrode CE2 may overlap with the first gate electrode G1 arranged below the first upper electrode CE2. The first gate electrode G1 and the first upper electrode CE2 may overlap with each other with the second gate insulating layer 113 therebetween, and may constitute the main storage capacitor Cst. In this case, the first gate electrode G1 may correspond to (e.g., may be) a first lower electrode CE1 of the main storage capacitor Cst.

At (e.g., in or on) the component area CA, the second upper electrode CE2' may overlap with the second gate electrode G2 arranged below the second upper electrode CE2'. The second gate electrode G2 and the second upper electrode CE2' may overlap with each other with the second gate insulating layer 113 therebetween, and may constitute the auxiliary storage capacitor Cst'. In this case, the second gate electrode G2 may correspond to (e.g., may be) a second lower electrode CE1' of the auxiliary storage capacitor Cst'.

The first upper electrode CE2 and the second upper electrode CE2' may include, for example, aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or multiple layers of one or more of these materials described above.

The interlayer insulating layer 115 may cover the first upper electrode CE2 and the second upper electrode CE2'. The interlayer insulating layer 115 may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 115 may include a single layer or multiple layers including one or more of the inorganic insulating materials described above.

The first gate insulating layer 112, the second gate insulating layer 113, and the interlayer insulating layer 115 may be collectively referred to as an inorganic insulating layer IL. In this case, in some embodiments, the inorganic insulating layer IL may have a first hole H1 corresponding to the transmission area TA. The first hole H1 may expose a portion of an upper surface of the buffer layer 111, or a portion of an upper surface of the substrate 100. The first hole H1 may be formed by overlapping an opening of the first gate insulating layer 112, an opening of the second gate insulating layer 113, and an opening of the interlayer insulating layer 115 corresponding to the transmission area TA with each other. These openings may each be formed through a separate process, or may be concurrently (e.g., simultaneously) formed through the same process. When the openings are formed through separate processes, an inner side surface of the first hole H1 may not be smooth, and may have a step-like structure (e.g., may have steps like a stair shape).

In other embodiments, the inorganic insulating layer IL may have a groove for exposing the buffer layer 111, rather than the first hole H1. In other embodiments, the inorganic insulating layer IL may not have the first hole H1 or the groove corresponding to the transmission area TA. In some embodiments, the inorganic insulating layer IL generally includes an inorganic insulating material having a suitable light transmittance (e.g., an excellent light transmittance), and accordingly, even when the inorganic insulating layer IL does not have a hole or a groove corresponding to the transmission area TA, the inorganic insulating layer IL may have sufficient transmittance, and thus, may allow the component 40 (e.g., refer to FIG. 2) to transmit/receive a sufficient amount of light.

The first and second source electrodes S1 and S2 and the first and second drain electrodes D1 and D2 may be arranged on the interlayer insulating layer 115. The first and second source electrodes S1 and S2 and the first and second drain electrodes D1 and D2 may include a conductive material including, for example, molybdenum (Mo), aluminum (Al), copper (Cu), titanium (Ti), and/or the like, and may include a single layer or multiple layers including one or more of these materials described above. As an example, the first and second source electrodes S1 and S2 and the first and second drain electrodes D1 and D2 may have (e.g., may each have) a multilayer structure of Ti/Al/Ti.

The planarization layer 117 may cover the first and second source electrodes S1 and S2 and the first and second drain electrodes D1 and D2. The planarization layer 117 may have a flat or a substantially flat upper surface so that a first pixel electrode 121 and a second pixel electrode 121' arranged thereon may be formed to be flat or substantially flat.

The planarization layer 117 may include an organic material or an inorganic material, and may have a single-layer structure or a multilayered structure. For example, in some embodiments, the planarization layer 117 may include a first planarization layer 117a, and a second planarization layer 117b. Accordingly, a conductive pattern of a wire, and/or the like may be formed between the first planarization layer 117a and the second planarization layer 117b, which may be desired (e.g., may be advantageous) for high integration.

The planarization layer 117 may include, for example, a general commercial polymer such as benzocyclobutene (BCB), polyimide, hexamethyldisiloxane (HMDSO), poly (methyl methacrylate) (PMMA), or polystyrene (PS), a polymer derivative having a phenol-based group, an acryl-based polymer, an imide-based polymer, an aryl ether-based polymer, an amide-based polymer, a fluorine-based polymer, a p-xylene-based polymer, or a vinyl alcohol-based polymer. The planarization layer 117 may include an inorganic insulating material, for example, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). When the planarization layer 117 is formed, a layer may be formed, and chemical and mechanical polishing may be performed on an upper surface of the layer to provide a flat or a substantially flat upper surface.

The first planarization layer 117a may cover the main and auxiliary pixel circuits PC and PC'. The second planarization layer 117b may be arranged on the first planarization layer 117a, and may have a flat or a substantially flat upper surface so that the first and second pixel electrodes 121 and 121' may be formed to be flat or substantially flat.

The main and auxiliary organic light-emitting diodes OLED and OLED' are arranged on the second planarization layer 117b. The first and second pixel electrodes 121 and 121' of the main and auxiliary organic light-emitting diodes OLED and OLED' may be connected to the main and auxiliary pixel circuits PC and PC', respectively, through connection electrodes CM and CM' arranged on the planarization layer 117.

The connection electrodes CM and CM' may be arranged between the first planarization layer 117a and the second planarization layer 117b. The connection electrodes CM and CM' may include a conductive material including, for example, molybdenum (Mo), aluminum (Al), copper (Cu), titanium (Ti), and/or the like, and may include a single layer or multiple layers including one or more of these materials described above. As an example, the connection electrodes CM and CM' may have (e.g., may each have) a multilayered structure of Ti/Al/Ti.

In the embodiment shown in FIG. 9, the bias wire BW may be arranged on the first planarization layer 117a, which is the same layer as that of the connection electrodes CM and CM'. The bias wire BW may be connected to the bottom metal layer BML arranged at (e.g., in or on) the component area CA through a contact hole BCNT.

The planarization layer 117 may have a second hole H2 corresponding to the transmission area TA. The second hole H2 may overlap with the first hole H1. FIG. 9 shows that the second hole H2 is larger than (e.g., has a larger width that that of) the first hole H1. However, the present disclosure is not limited thereto, for example, in another embodiment, the planarization layer 117 may cover the edge of the first hole H1 of the inorganic insulating layer IL, and thus, an area (e.g., a width) of the second hole H2 may be smaller than that of the first hole H1.

The planarization layer 117 has a via hole exposing one of the first source electrode S1 and the first drain electrode D1 of the main thin film transistor TFT, and the first pixel electrode 121 may be electrically connected to the main thin film transistor TFT by contacting the first source electrode S1 or the first drain electrode D1 through the via hole. Further, the planarization layer 117 has a via hole exposing one of the second source electrode S2 and the second drain electrode D2 of the auxiliary thin film transistor TFT', and the second pixel electrode 121' may be electrically connected to the auxiliary thin film transistor TFT' by contacting the second source electrode S2 or the second drain electrode D2 through the via hole.

The first pixel electrode 121 and the second pixel electrode 121' may include a conductive oxide, for example, such as indium tin oxide (ITO), indium zinc oxide (IZO), zinc oxide (ZnO), indium oxide ($In_2O_3$), indium gallium oxide (IGO), or aluminum zinc oxide (AZO). The first pixel electrode 121 and the second pixel electrode 121' may include a reflective film including, for example, silver (Ag), magnesium (Mg), aluminum (Al), platinum (Pt), palladium (Pd), gold (Au), nickel (Ni), neodymium (Nd), iridium (Ir), chromium (Cr), or a compound thereof. For example, in some embodiments, the first pixel electrode 121 and the second pixel electrode 121' may have a structure having one or more films on/under the reflective film described above, and the one or more films may include, for example, ITO, IZO, ZnO, and/or $In_2O_3$. In this case, the first pixel electrode 121 and the second pixel electrode 121' may have (e.g., may each have) a stacked structure of ITO/Ag/ITO.

A pixel-defining layer 119 may be arranged on the planarization layer 117, and may cover the edge of each of the first pixel electrode 121 and the second pixel electrode 121'. For example, the pixel-defining layer 119 may include a first opening OP1 and a second opening OP2 exposing central portions (e.g., center portions) of the first pixel electrode 121 and the second pixel electrode 121', respectively. Emission areas of the main and auxiliary organic light-emitting diodes OLED and OLED', or in other words, sizes and shapes of the main and auxiliary sub-pixels Pm and Pa, are defined by the first opening OP1 and the second opening OP2, respectively.

The pixel-defining layer 119 may prevent or substantially prevent an arc, and/or the like from occurring at the edge of the first and second pixel electrodes 121 and 121' by increasing a distance between the edge of the first and second pixel electrodes 121 and 121' and an opposite electrode 123 arranged over the first and second pixel electrodes 121 and 121'. The pixel-defining layer 119 may be formed by a suitable method, for example, such as spin coating, using an organic insulating material, for example, such as polyimide, polyamide, acrylic resin, BCB, HMDSO, phenol resin, and/or the like.

The pixel-defining layer 119 may include a third hole H3 at (e.g., in or on) the transmission area TA. The third hole H3 may overlap with the first hole H1 and the second hole H2.

Light transmittance in the transmission area TA may be improved by the first to third holes H1 to H3. Although FIG. 9 shows the buffer layer 111 arranged continuously with respect to the transmission area TA, in other embodiments, the buffer layer 111 may include a hole at (e.g., in or on) the transmission area TA, for example, to expose a top surface of the substrate 100. A portion of the opposite electrode 123, which will be described in more detail below, may be arranged on inner side surfaces of the first to third holes H1 to H3.

A first emission layer 122b and a second emission layer 122b' are arranged at (e.g., in or on) the first opening OP1 and the second opening OP2 of the pixel-defining layer 119 to correspond to the first pixel electrode 121 and the second pixel electrode 121', respectively. The first emission layer 122b and the second emission layer 122b' may include a polymer material or a low-molecular weight material, and may emit red light, green light, blue light, or white light.

An organic functional layer 122e may be arranged on and/or under the first emission layer 122b and the second emission layer 122b'. For example, in some embodiments, the organic functional layer 122e may include a first functional layer 122a and/or a second functional layer 122c. However, the present disclosure is not limited thereto, and the first functional layer 122a and/or the second functional layer 122c may be omitted.

The first functional layer 122a may be arranged under (e.g., underneath) the first emission layer 122b and the second emission layer 122b'. The first functional layer 122a may include a single layer or multiple layers including an organic material. In some embodiments, the first functional layer 122a may be a hole transport layer (HTL) having a single-layer structure. In other embodiments, the first functional layer 122a may include a hole injection layer (HIL) and an HTL. The first functional layer 122a may be integrally formed to correspond to the main and auxiliary organic light-emitting diodes OLED and OLED' included at (e.g., in or on) the main display area MDA and the component area CA.

The second functional layer 122c may be arranged on the first emission layer 122b and the second emission layer 122b'. The second functional layer 122c may include a single layer or multiple layers including an organic material. The second functional layer 122c may include an electron transport layer (ETL) and/or an electron injection layer (EIL). The second functional layer 122c may be integrally formed to correspond to the main and auxiliary organic light-emitting diodes OLED and OLED' included at (e.g., in or on) the main display area MDA and the component area CA.

The opposite electrode 123 is arranged on the second functional layer 122c. The opposite electrode 123 may include a conductive material having a low work function. For example, in some embodiments, the opposite electrode 123 may include a (semi)transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. In some embodiments, the opposite electrode 123 may further include a layer, for example, such as ITO, IZO, ZnO, or $In_2O_3$, on a (semi) transparent layer including one or more of the materials described above. The opposite electrode 123 may be integrally formed to correspond to the main and auxiliary organic light-emitting diodes OLED and OLED' included at (e.g., in or on) the main display area MDA and the component area CA.

Layers from the first pixel electrode 121 formed at (e.g., in or on) the main display area MDA to the opposite electrode 123 may constitute the main organic light-emitting diode OLED. Layers from the second pixel electrode 121' formed at (e.g., in or on) the component area CA to the opposite electrode 123 may constitute the auxiliary organic light-emitting diode OLED'.

An upper layer 150 including an organic material may be formed on the opposite electrode 123. The upper layer 150 may be a layer for protecting the opposite electrode 123, and increasing outcoupling efficiency. In some embodiments, the upper layer 150 may include an organic material having a higher refractive index than that of the opposite electrode 123. In some embodiments, layers having different refractive indexes from each other may be stacked at (e.g., in or on) the upper layer 150. For example, the upper layer 150 may include a high refractive index layer/a low refractive index layer/a high refractive index layer that are stacked on one another. In this regard, a refractive index of the high refractive index layer may be 1.7 or greater, and a refractive index of the low refractive index layer may be 1.3 or less.

In some embodiments, the upper layer 150 may additionally include lithium fluoride (LiF). In other embodiments, the upper layer 150 may additionally include an inorganic insulating material, for example, such as silicon oxide ($SiO_2$) or silicon nitride (SiNx).

The first functional layer 122a, the second functional layer 122c, the opposite electrode 123, and the upper layer 150 may include a transmission hole TAH corresponding to the transmission area TA. In other words, the first functional layer 122a, the second functional layer 122c, the opposite electrode 123, and the upper layer 150 may respectively have openings corresponding to the transmission area TA. Areas of the openings may be the same or substantially the same as one another. For example, an area of an opening of the opposite electrode 123 may be the same or substantially the same as an area of the transmission hole TAH.

The expression "transmission hole TAH corresponding to the transmission area TA" as used herein may be understood as the "transmission hole TAH overlapping with the transmission area TA." In this regard, an area (e.g., a width) of the transmission hole TAH may be smaller than that of the first hole H1 formed in the inorganic insulating layer IL. For example, FIG. 9 shows a width Wt of the transmission hole TAH that is smaller than a width of the first hole H1. In this regard, an area of the transmission hole TAH may be defined as an area of an opening having the smallest area from among the openings constituting the transmission hole TAH. An area of the first hole H1 may also be defined as an area of an opening having the smallest area from among the openings constituting the first hole H1.

Due to the transmission hole TAH, a portion of the opposite electrode 123 may not be present at (e.g., in or on) the transmission area TA, and thus, light transmittance at (e.g., in or on) the transmission area TA may increase (e.g., may significantly increase). The opposite electrode 123 including the transmission hole TAH may be formed by various suitable methods. For example, in an embodiment, a material for forming the opposite electrode 123 may be formed over the entire surface of the substrate 100, and then, a portion corresponding to the transmission area TA may be removed through laser lift off to form the opposite electrode 123 having the transmission hole TAH. In another embodiment, the opposite electrode 123 having the transmission hole TAH may be formed through a metal self-patterning (MSP) method. In another embodiment, the opposite electrode 123 having the transmission hole TAH may be formed through a method of depositing the opposite electrode 123 by using a fine metal mask (FMM).

The bottom metal layer BML of the component area CA may correspond to the entire component area CA. In this case, the bottom metal layer BML may include a lower hole BMLH overlapping with the transmission area TA. In some embodiments, a shape and/or size of the transmission area TA may be defined by a shape and/or size of the lower hole BMLH.

In some embodiments, it may be desirable to not arrange the bottom metal layer BML at (e.g., in or on) the main display area MDA. For example, when the bottom metal layer BML is provided over the entire surface or over most part of the substrate 100, a defect may occur during a process of crystallizing the first semiconductor layer A1 of the main thin film transistor TFT by using a laser.

In the embodiment shown in FIG. 9, the bottom metal layer BML may correspond to only the component area CA, and thus, a defect rate in the process of forming the display panel 10 may be reduced.

Figure 10:
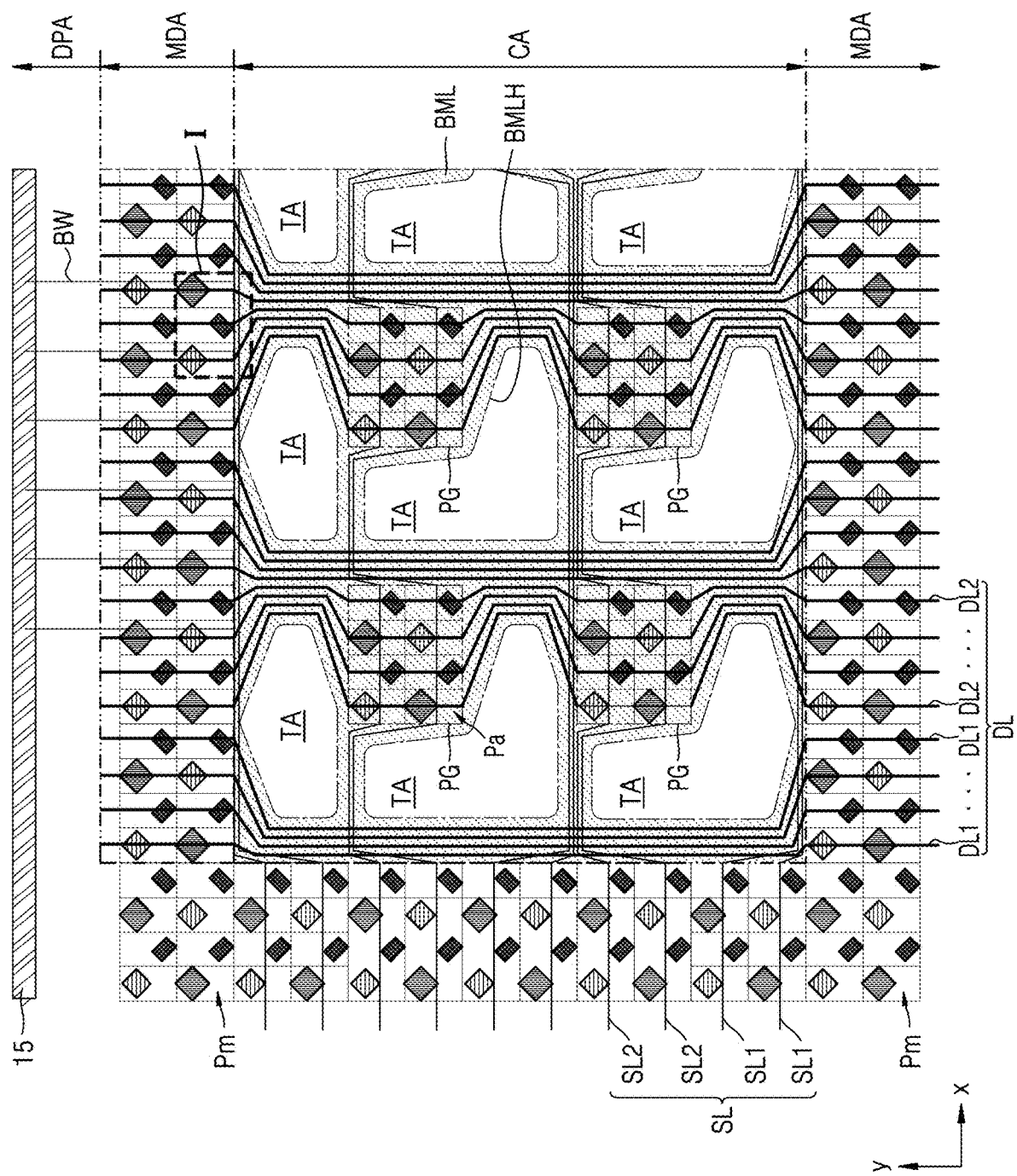
FIG. 10 is a schematic plan view of arrangement relationships between sub-pixels, some wires, and a bottom metal layer of a display panel according to an embodiment.

FIG. 10 is a schematic plan view of arrangement relationships between sub-pixels, some wires, and a bottom metal layer of a display panel according to an embodiment. Because the plan view of FIG. 10 shows only a portion of the display panel, other sub-pixels of the display panel may be omitted. In addition, because the plan view of FIG. 10 shows only some of the wires for convenience of illustration and description, other wires may be omitted. In other words, the plan view of FIG. 10 shows only a portion of the component area CA and the main display area MDA outside (e.g., adjacent to) the component area CA.

Referring to FIG. 10, the scan line SL may extend in the x-axis direction, and may transmit scan signals to pixel circuits of the main sub-pixels Pm and to the pixel circuits of the auxiliary sub-pixels Pa. The data line DL may extend in the y-axis direction, and may transmit data signals to pixel circuits of the main sub-pixels Pm and to the pixel circuits of the auxiliary sub-pixels Pa.

The scan line SL may include first scan lines SL1 and second scan lines SL2. The first scan lines SL1 may extend in the x-axis direction, and may be electrically connected to pixel circuits of the main sub-pixels Pm arranged at (e.g., in or on) the same row as each other at (e.g., in or on) the main display area MDA. The first scan lines SL1 may cross the transmission area TA without being connected to the pixel circuit of the auxiliary sub-pixel Pa. The second scan lines SL2 may extend in the x-axis direction, and may be electrically connected to the pixel circuit of the main sub-pixel Pm and the pixel circuit of the auxiliary sub-pixel Pa arranged at (e.g., in or on) the same row as each other at (e.g., in or on) the main display area MDA and the component area CA.

The data line DL may include first data lines DL1 and second data lines DL2. The first data lines DL1 may extend in or substantially in the y-axis direction, and may be electrically connected to pixel circuits of the main sub-pixels Pm arranged at (e.g., in or on) the same column as each other at (e.g., in or on) the main display area MDA arranged on a lower side of the component area CA, may cross the transmission area TA of the component area CA, and may be electrically connected to pixel circuits of the main sub-pixels Pm arranged at (e.g., in or on) the same column as each other at (e.g., in or on) the main display area MDA arranged on an upper side of the component area CA. The second data lines DL2 may extend in the y-axis direction, and may be electrically connected to the pixel circuit of the main sub-pixel Pm and the pixel circuit of the auxiliary sub-pixel Pa arranged at (e.g., in or on) the same column as each other at (e.g., in or on) the main display area MDA and the component area CA. The data line DL may be arranged on a different layer from that of the scan line SL.

Although FIG. 10 shows scan lines SL and data lines DL continuously provided at (e.g., in or on) the main display area MDA and the component area CA, the scan lines SL and the data lines DL may be connected to bridge lines arranged on different layers from those of the scan lines SL and/or the data lines DL at (e.g., in or on) some areas.

As shown in FIG. 10, the scan lines SL and the data lines DL arranged at (e.g., in or on) the component area CA may be biased to one side thereof, instead of being arranged at (e.g., in or on) a center portion of the transmission area TA, to increase light transmittance in the component area CA. For example, the scan lines SL and the data lines DL arranged at (e.g., in or on) the component area CA may be properly bent. Accordingly, a distance between the scan lines SL passing between the pixel groups PG spaced apart from each other may be smaller than a distance between the scan lines SL passing through sub-pixels in the pixel group PG. Further, a distance between the data lines DL passing between the pixel groups PG spaced apart from each other may be smaller than a distance between the data lines DL passing through sub-pixels in the pixel group PG.

In some embodiments, the first data lines DL1 arranged between the pixel groups PG spaced apart from each other may be biased to the left (e.g., in the x-axis direction) of the pixel groups PG, and the second data lines DL2 may be biased to the right (e.g., in the x-axis direction) of the pixel groups PG. In some embodiments, the first scan lines SL1 arranged between the pixel groups PG spaced apart from each other may be biased downward (e.g., biased below in the y-axis direction of the pixel groups PG), and the second scan lines SL2 may be biased upward (e.g., biased above in the y-axis direction of the pixel groups PG).

According to the above described wiring arrangement structure, light transmittance of the transmission area TA and light transmission of the entire component area CA may be improved. As a distance between wires arranged at (e.g., in or on) the component area CA decreases, diffraction of light may occur, and accordingly, the bottom metal layer BML may be arranged to overlap with the wires arranged at (e.g., in or on) the component area CA.

In some embodiments, the bottom metal layer BML may correspond to the entire component area CA, and may include the lower hole BMLH corresponding to the transmission area TA. In some embodiments, the bottom metal layer BML may not be arranged at (e.g., in or on) the main display area MDA.

The bottom metal layer BML may be connected to the bias voltage supply line arranged at (e.g., in or on) the peripheral area DPA through the bias wire BW. The bias wire BW may be connected to an edge portion of the bottom metal layer BML through a contact hole.

Hereinafter, an arrangement of the bias wire BW according to one or more example embodiments of the present disclosure will be described in more detail.

Figure 11:
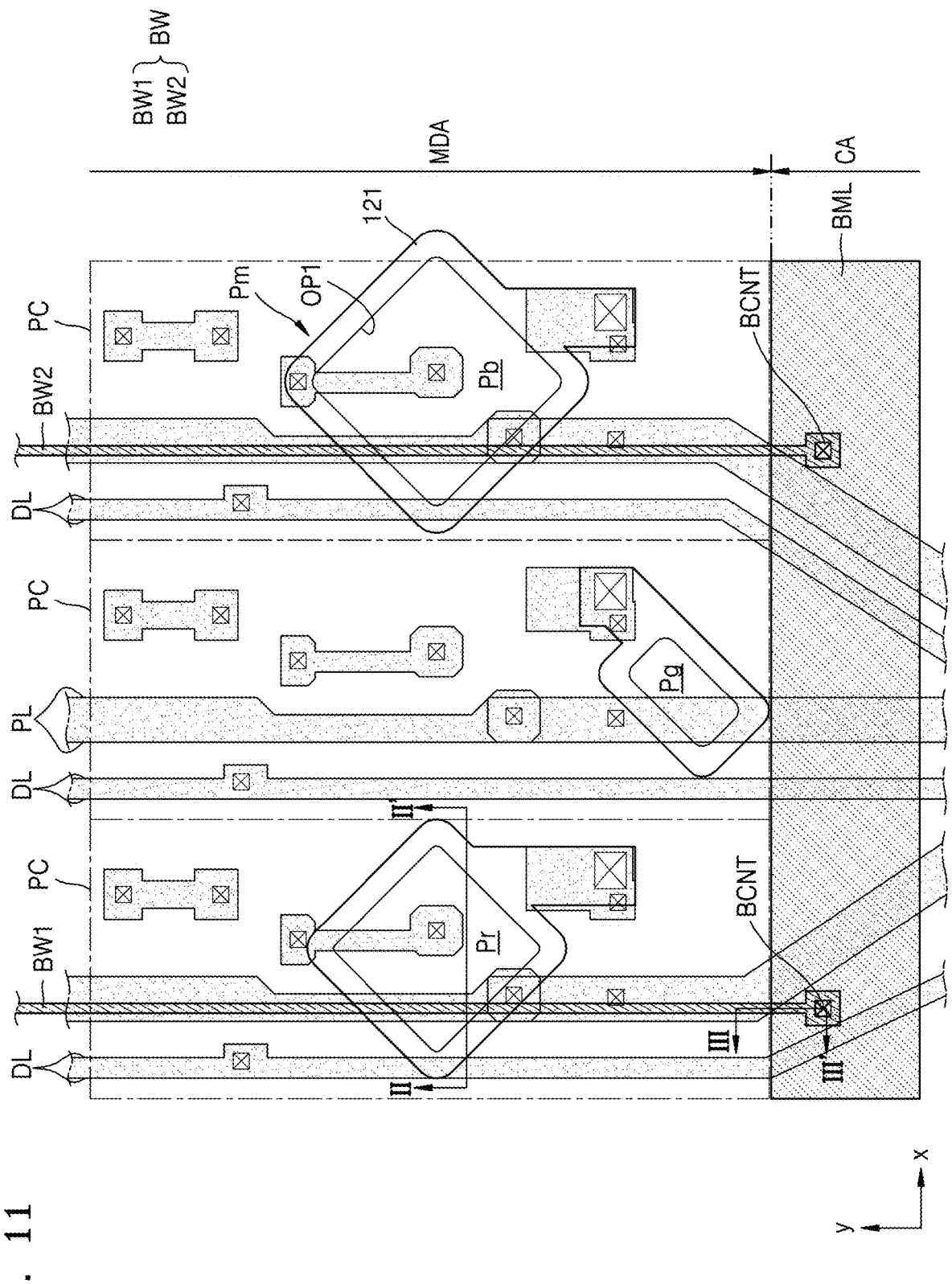
FIG. 11 is an enlarged plan view of the portion I of FIG. 10 according to an embodiment.
Figure 12:
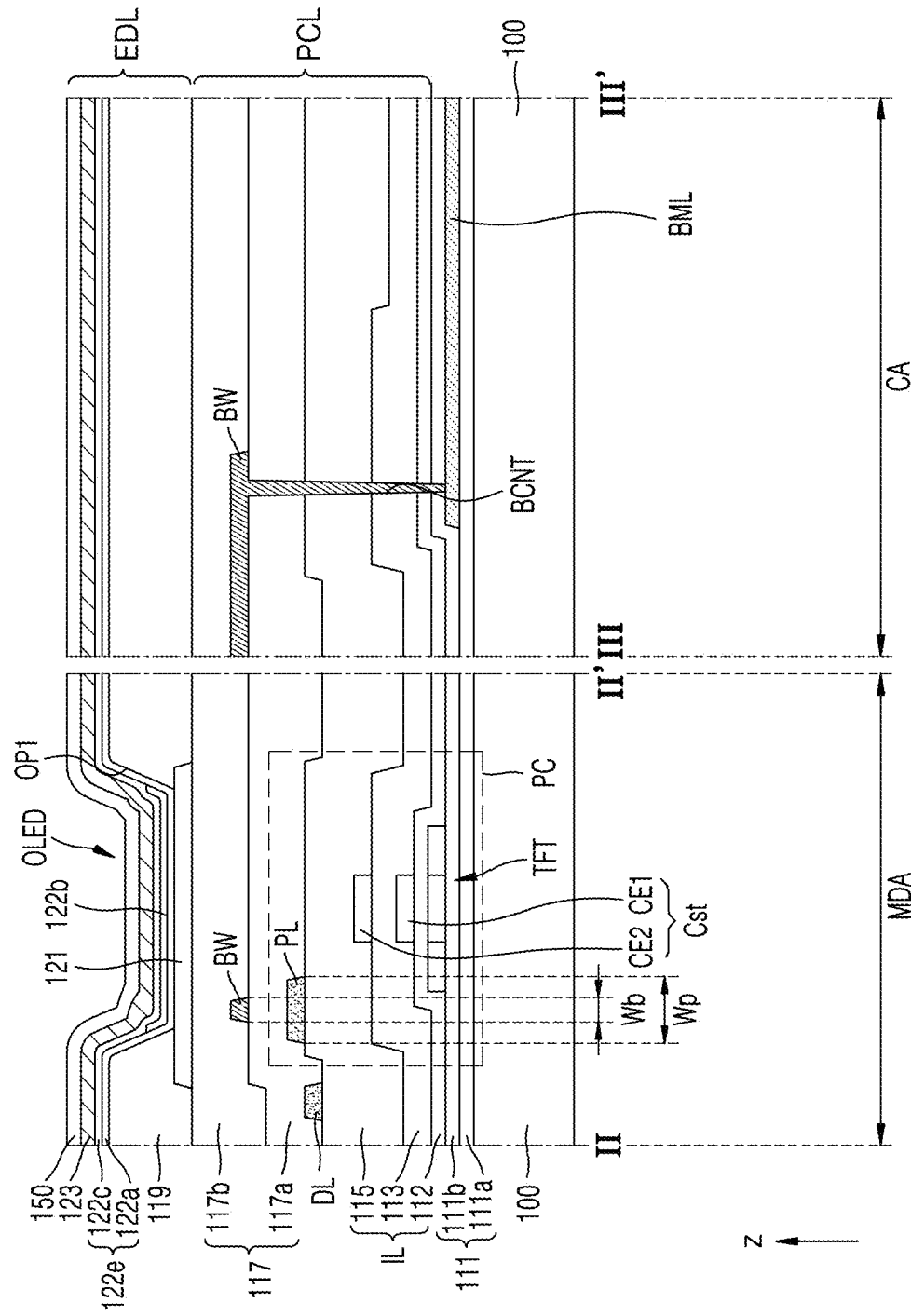
FIG. 12 is a schematic cross-sectional view corresponding to the lines II-II' and III-II' of FIG. 11 according to an embodiment.

FIG. 11 is an enlarged plan view of the portion I of FIG. 10, and FIG. 12 is a schematic cross-sectional view corresponding to the lines II-II' and III-III' of FIG. 11. However, because FIGS. 11 and 12 show only a partial configuration for convenience of illustration and description, other configurations are not shown.

Referring to FIGS. 11 and 12, a display panel according to an embodiment includes the bottom metal layer BML corresponding to the component area CA, and the bias wire BW connected to the bottom metal layer BML.

The driving voltage line PL and the data line DL, which may be spaced apart from each other and may extend in the y-axis direction, may be arranged at (e.g., in or on) the main display area MDA. In an embodiment, the bias wire BW extends in the y-axis direction, and may overlap with the driving voltage line PL.

The main sub-pixels Pm of the red sub-pixel Pr, the green sub-pixel Pg, and the blue sub-pixel Pb may be arranged in a PenTile structure at (e.g., in or on) the main display area MDA. The first pixel electrode 121 of the main sub-pixel Pm may at least partially overlap with the data line DL and the driving voltage line PL. In some embodiments, the first pixel electrode 121 of the main sub-pixel Pm may at least partially overlap with the bias wire BW. The first pixel electrode 121 may be connected to a thin film transistor arranged below the first pixel electrode 121 through the connection electrode CM (e.g., see FIG. 9). A size of the main sub-pixel Pm may be defined by the first opening OP1 of the pixel-defining layer 119 covering the edge of the first pixel electrode 121.

The bias wire BW may pass through the main display area MDA arranged between a peripheral area and the component area CA, and may be connected to an edge portion of the bottom metal layer BML through a contact hole BCNT.

In an embodiment, the bias wire BW may overlap with the driving voltage line PL extending in or substantially in the y-axis direction at (e.g., in or on) the main display area MDA. The bias wire BW may be arranged on the first planarization layer 117a covering the driving voltage line PL. In other words, the driving voltage line PL may be arranged between the bias wire BW and the thin film transistor TFT and the storage capacitor Cst included in the pixel circuit PC. The driving voltage line PL may serve as a shielding electrode, and because the driving voltage line PL may be arranged below the bias wire BW, a coupling phenomenon that may be formed between the bias wire BW and the pixel circuit PC may be reduced.

In some embodiments, a width Wb of the bias wire BW in the x-axis direction may be smaller than a width Wp of the driving voltage line PL in the x-axis direction. Further, the bias wire BW may overlap with a central portion (e.g., a center portion) of the driving voltage line PL. Accordingly, a coupling phenomenon due to the bias wire BW may be reduced.

In some embodiments, the bias wire BW may be connected to the bottom metal layer BML through the contact hole BCNT penetrating through the first planarization layer 117a, the inorganic insulating layer IL, and the second buffer layer 111b. In other embodiments, unlike the embodiment illustrated in FIG. 12, an intermediate electrode layer may be further included to connect the bias wire BW and the bottom metal layer BML to each other.

As shown in FIG. 11, the bias wire BW may be arranged along columns in which the red sub-pixel Pr and the blue sub-pixel Pb from among the main sub-pixels Pm are arranged. In other words, the bias wire BW may include a first bias wire BW1 overlapping with the red sub-pixel Pr, and a second bias wire BW2 overlapping with the blue sub-pixel Pb. In some embodiments, the bias wire BW may overlap with first pixel electrodes 121 of the red sub-pixel Pr and the blue sub-pixel Pb.

Figure 13:
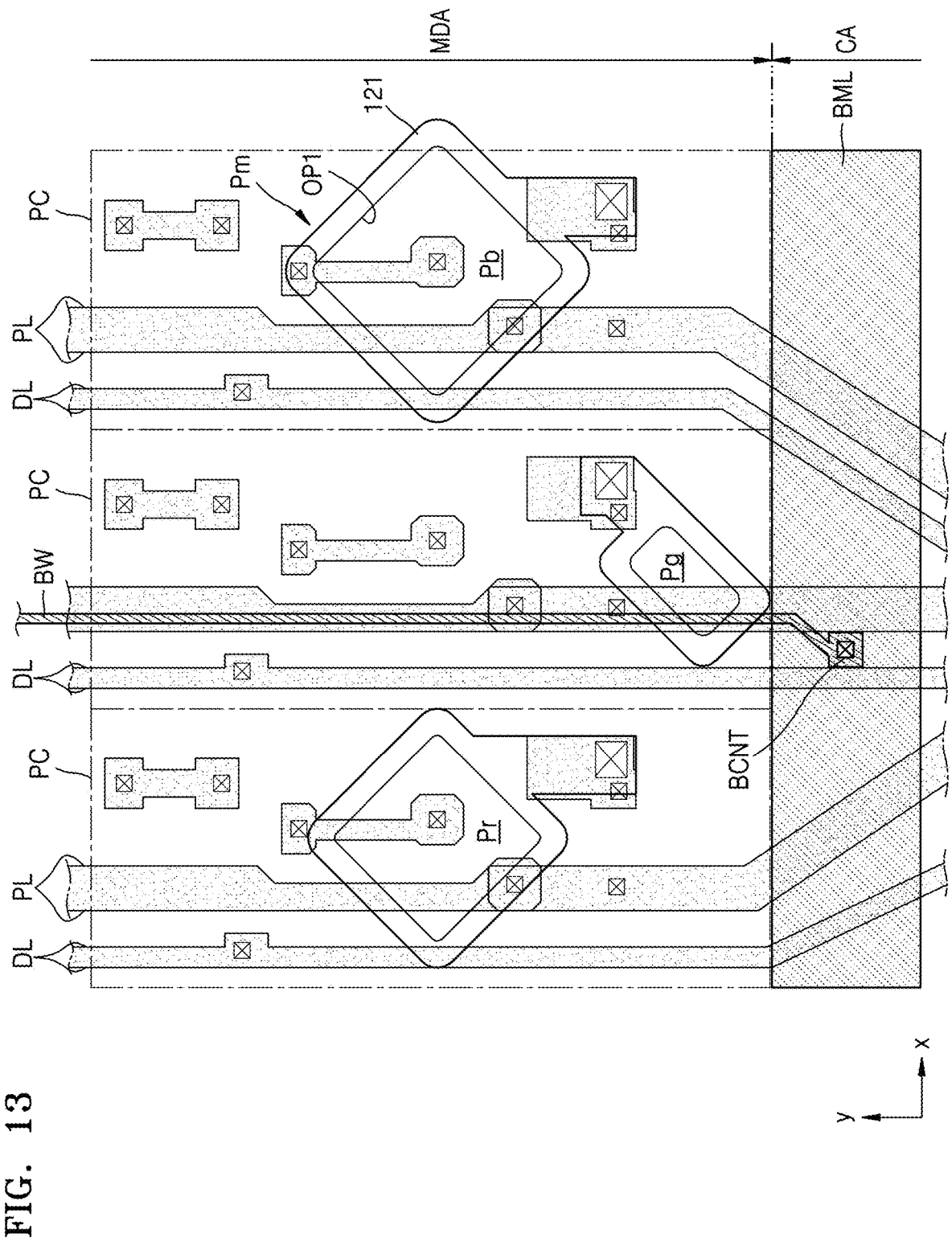
FIG. 13 is a schematic plan view of a display panel according to an embodiment.

FIG. 13 is a schematic plan view of a display panel according to an embodiment. In FIG. 13, the same elements as those of FIG. 11 are denoted with the same reference symbols, and thus, redundant description thereof may not be repeated.

Referring to FIG. 13, the bias wire BW may pass through the main display area MDA arranged between a peripheral area and the component area CA, and may be connected to an edge portion of the bottom metal layer BML through the contact hole BCNT. In the embodiment shown in FIG. 13, the bias wire BW may be arranged along a column in which the green sub-pixel Pg from among the main sub-pixels Pm is arranged. In this case, the bias wire BW may overlap with the first pixel electrode 121 of the green sub-pixel Pg.

Figure 14:
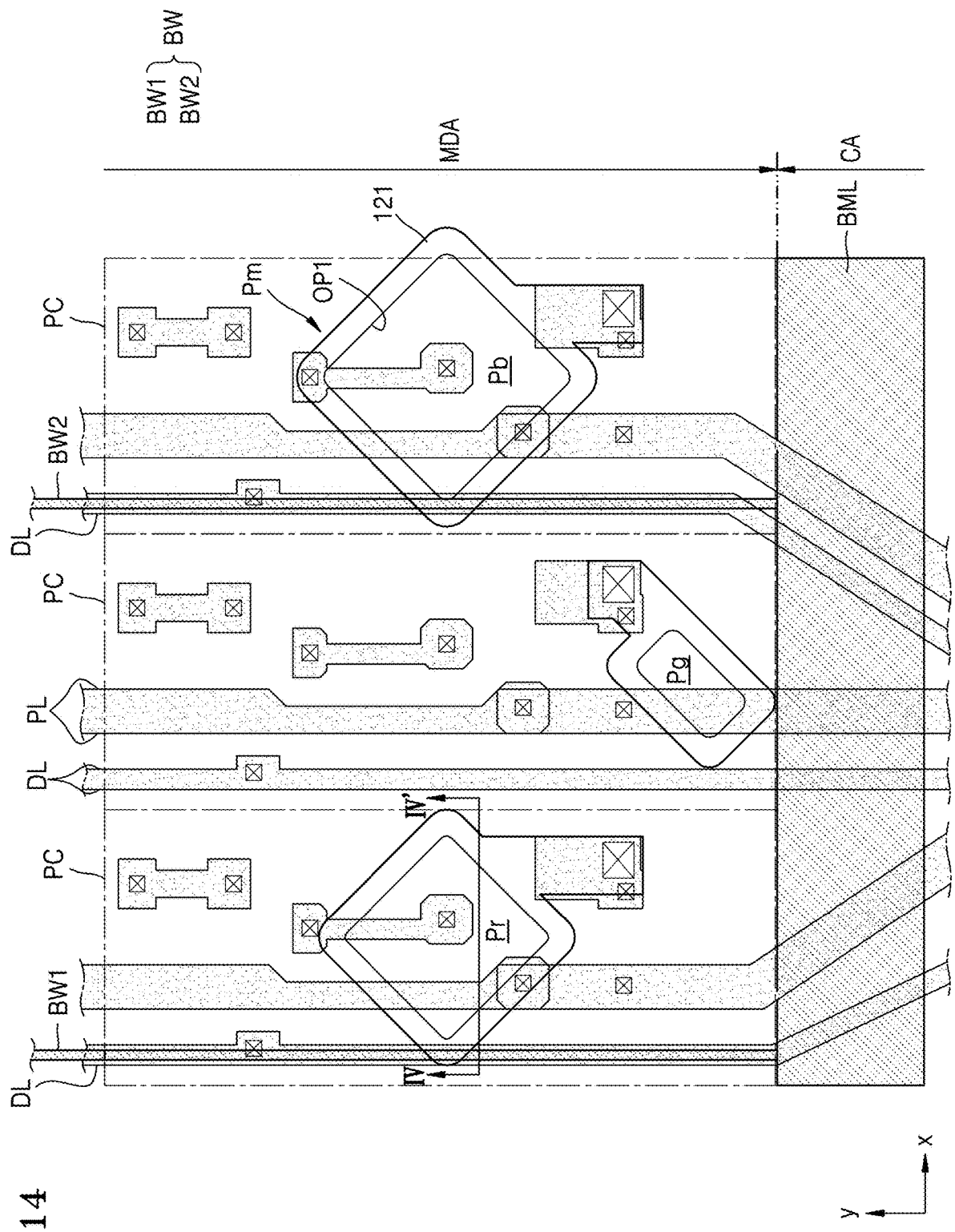
FIG. 14 is a schematic plan view of a display panel according to an embodiment.
Figure 15:
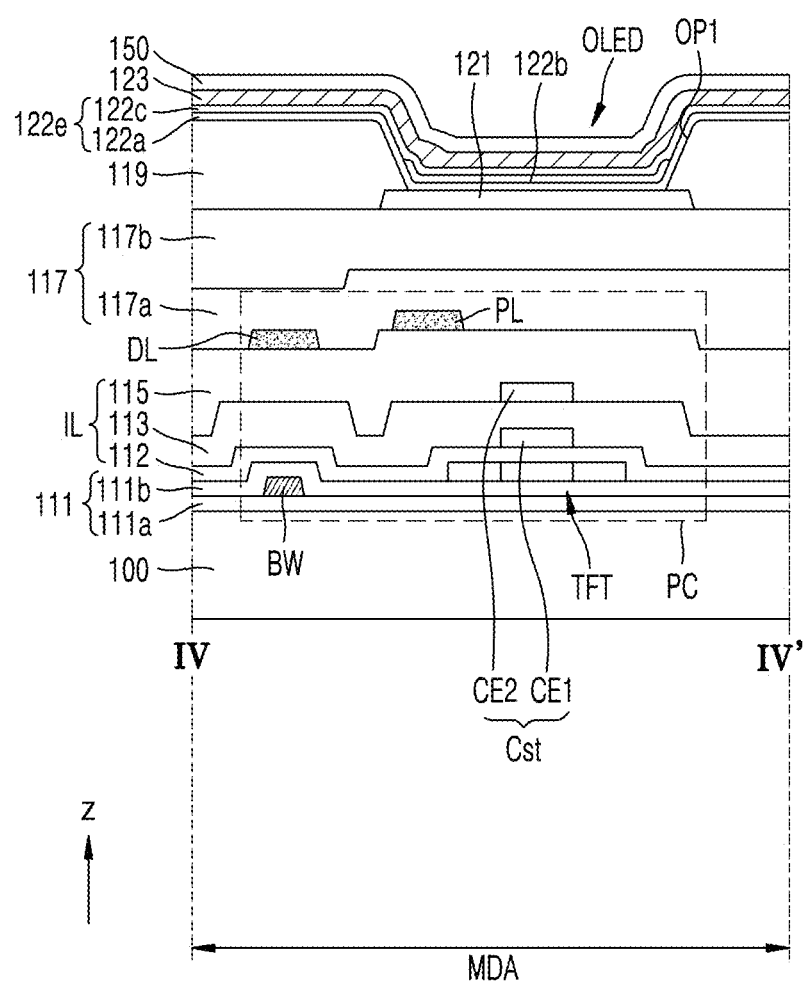
FIG. 15 is a cross-sectional view of the display panel taken along the line IV-IV' of FIG. 14 according to an embodiment.

FIG. 14 is a schematic plan view of a display panel according to an embodiment, and FIG. 15 is a cross-sectional view of the display panel taken along the line IV-IV' of FIG. 14. In FIGS. 14 and 15, the same elements as those of FIGS. 11 and 12 are denoted with the same reference symbols, and thus, redundant description thereof may not be repeated.

Referring to FIGS. 14 and 15, the bias wire BW passes through the main display area MDA arranged between a peripheral area and the component area CA, and is connected to the bottom metal layer BML.

In an embodiment, the bias wire BW may be integrally provided with the bottom metal layer BML. That is, the bias wire BW may be arranged on the first buffer layer 111a, which is the same layer as the bottom metal layer BML, and may be branched in a plurality of numbers from the bottom metal layer BML to extend in the y-axis direction.

Layers formed on the bias wire BW may have a curve or a step due to the bias wire BW. In this case, if a semiconductor layer of the thin film transistor TFT is formed on the step in a process, the step may cause a defect in the process.

Accordingly, in an embodiment, the bias wire BW may overlap with the data line DL, thereby reducing an overlap of the bias wire BW with one or more semiconductor layers of thin film transistors TFT. Accordingly, defects of the thin film transistors TFT may be reduced.

In some embodiments, the bias wire BW may overlap with the data lines DL of columns in which pixel circuits of the red sub-pixel Pr and the blue sub-pixel Pb are arranged. In other embodiments, the bias wire BW may overlap with the data line DL of a column in which a pixel circuit of the green sub-pixel Pg is arranged.

Figure 16:
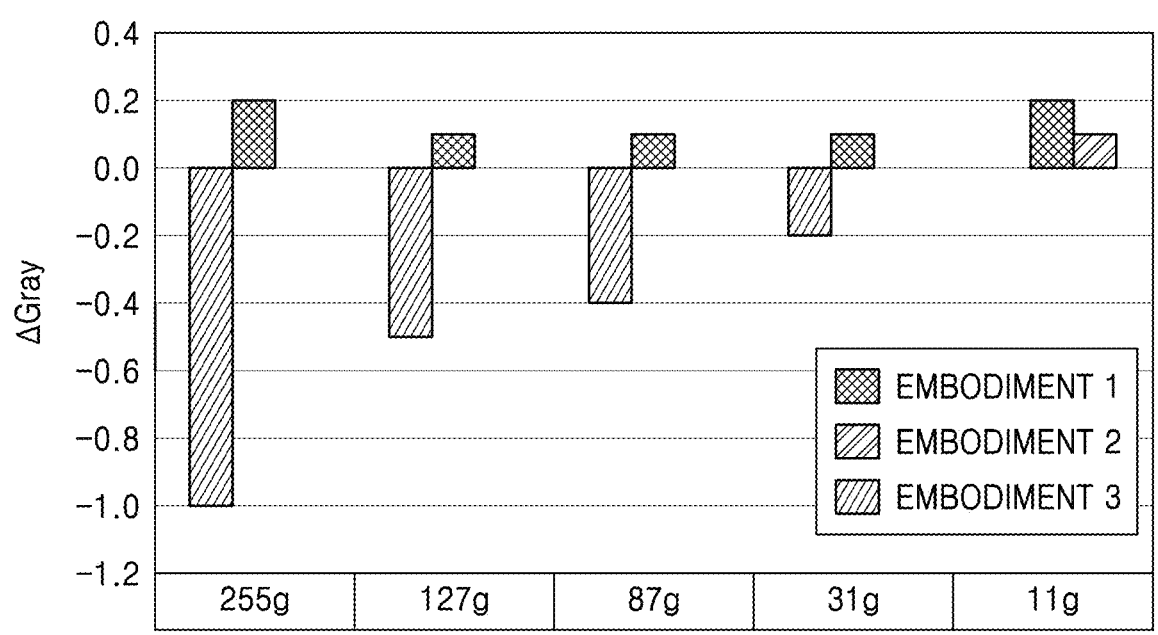
FIG. 16 shows simulation results with regard to a luminance change of a gray color when no bias wire is used, according to one or more embodiments.

FIG. 16 shows simulation results with regard to a luminance change of a gray color when no bias wire is used, according to one or more embodiments.

In FIG. 16, (Embodiment 1) corresponds to the embodiment of FIG. 11, and illustrates a case where the bias wire BW is arranged on the first planarization layer 117a (e.g., refer to FIG. 12) and overlaps with a red sub-pixel and a blue sub-pixel. In the case of (Embodiment 1), it may be seen that a luminance change of a gray color is not greater than 0.2 at a gray level of 11 to 255.

In FIG. 16, (Embodiment 2) corresponds to the embodiment of FIG. 13, and illustrates a case where the bias wire BW is arranged on the first planarization layer 117a (e.g., refer to FIG. 12) and overlaps with a green sub-pixel. In the case of (Embodiment 2), it may be seen that a luminance change of a gray color is small (e.g., is little or negligible) at a gray level of 31 to 255, and is about 0.1 when the gray level is 11. In other words, it can be confirmed that (Embodiment 2) shows the smallest change.

In FIG. 16, (Embodiment 3) corresponds to the embodiment of FIG. 14, and illustrates a case where the bias wire BW is arranged on the same layer as that of the bottom metal layer BML (e.g., refer to FIG. 15) and overlaps with pixel circuits of a red sub-pixel and a blue sub-pixel. In the case of (Embodiment 3), it may be seen that, as the gray level increases, a luminance change of a gray color increases but is not greater than −1.0. When a luminance change of a gray color is ±1.0 or less, the luminance change is insignificant, and it may be seen that all of the embodiments of (Embodiment 1) to (Embodiment 3) have little effect on the luminance change.

As described above, a display panel and a display apparatus according to one or more example embodiments of the present disclosure include a bias wire arranged on a different layer from that of a driving voltage line, and because the bias wire is connected to a bottom metal layer, a change in characteristics of the display panel due to a voltage applied to the bottom metal layer may be reduced. However, aspects and features of the present disclosure are not limited to such example effects.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display panel comprising:
a substrate including a main display area, a component area comprising a transmission area, and a periphery area outside the main display area;
main display elements on the substrate to correspond to the main display area;
main pixel circuits respectively connected to the main display elements;
auxiliary display elements on the substrate to correspond to the component area;
auxiliary pixel circuits respectively connected to the auxiliary display elements;
a driving voltage line configured to apply a driving voltage to the main pixel circuits;
a data line configured to apply a data signal to the main pixel circuits;
a bottom metal layer between the substrate and the auxiliary pixel circuits at the component area; and
a bias wire connected to the bottom metal layer, and located at the main display area,
wherein the main pixel circuits and the auxiliary pixel circuits are arranged on the same level and disposed on the same substrate.

2. The display panel of claim 1, further comprising:
a bias voltage supply line at the periphery area,
wherein the bias wire is connected to the bias voltage supply line.

3. The display panel of claim 1, wherein the bias wire is at a different layer from that of the driving voltage line, and at least partially overlaps with the driving voltage line.

4. The display panel of claim 3, wherein a width of the bias wire is less than that of the driving voltage line.

5. The display panel of claim 1, wherein the bias wire is located over the driving voltage line, and is connected to the bottom metal layer through a contact hole.

6. The display panel of claim 1, wherein the main display elements of the main display area implement main sub-pixels comprising red, green, and blue pixels, and
wherein the bias wire comprises a first bias wire overlapping with the red pixel, and a second bias wire overlapping with the blue pixel.

7. The display panel of claim 6, wherein the main sub-pixels are arranged in a PenTile structure.

8. The display panel of claim 1, wherein the main display elements of the main display area implement main sub-pixels comprising red, green, and blue pixels, and
wherein the bias wire overlaps with the green pixel.

9. The display panel of claim 1, wherein the bias wire is integrally formed with the bottom metal layer, and overlaps with the data line.

10. The display panel of claim 9, wherein the main display elements of the main display area implement main sub-pixels comprising red, green, and blue pixels, and
wherein the bias wire comprises a first bias wire overlapping with a pixel circuit from among the main pixel circuits configured to drive the red pixel, and a second bias wire overlapping with a pixel circuit from among the main pixel circuits configured to drive the blue pixel.

11. The display panel of claim 1, wherein the bottom metal layer comprises a lower hole corresponding to the transmission area.

12. The display panel of claim 1, wherein at least some wires that pass through the component area are bent to bypass the transmission area.

13. The display panel of claim 1, wherein:
the component area comprises a plurality of pixel groups, each comprising a plurality of the auxiliary display elements;
the transmission area comprises a plurality of transmission areas corresponding to the component area; and
the plurality of pixel groups and the plurality of transmission areas are alternately arranged at the component area.

14. The display panel of claim 1, wherein the bottom metal layer overlaps with the auxiliary pixel circuits at the component area in a stacking direction.

15. The display panel of claim 1, wherein the main pixel circuits surround at least a part of the auxiliary pixel circuits.

16. A display apparatus comprising:
a display panel comprising:
a main display area comprising main sub-pixels; and
a component area comprising auxiliary sub-pixels and a transmission area; and
a component located below the display panel, and corresponding to the component area,
wherein the display panel further comprises:
a substrate;
a driving voltage line over the substrate at the main display area;
a bottom metal layer at the component area, and located between the substrate and auxiliary pixel circuits configured to drive the auxiliary sub-pixels; and
a bias wire connected to the bottom metal layer, and located at a different layer from that of the driving voltage line, and wherein the bottom metal layer comprises a lower hole corresponding to the transmission area.

17. The display panel of claim 16, wherein the bias wire at least partially overlaps with the driving voltage line.

18. The display panel of claim 17, wherein a width of the bias wire is less than that of the driving voltage line.

19. The display panel of claim 16, wherein the bias wire comprises a plurality of bias wires, and is integrally formed with the bottom metal layer.

20. The display panel of claim 16, wherein at least some wires that pass through the component area are bent to bypass the transmission area.

21. A display apparatus comprising:
  a display panel comprising:
    a main display area comprising main sub-pixels; and
    a component area comprising auxiliary sub-pixels and a transmission area; and
  a component located below the display panel, and corresponding to the component area,
  wherein the display panel further comprises:
    a substrate;
    a driving voltage line over the substrate at the main display area;
    a bottom metal layer at the component area, and located between the substrate and auxiliary pixel circuits configured to drive the auxiliary sub-pixels; and
    a bias wire connected to the bottom metal layer, and located at a different layer from that of the driving voltage line,
  wherein the main sub-pixels comprise red, green, and blue pixels, and
  wherein the bias wire overlaps with at least one of the red, green, or blue pixels.

* * * * *